United States Patent [19]
Weitekamp et al.

[11] Patent Number: 6,100,687
[45] Date of Patent: Aug. 8, 2000

[54] FORCE-DETECTED MAGNETIC RESONANCE INDEPENDENT OF FIELD GRADIENTS

[75] Inventors: Daniel P. Weitekamp, Altadena; Garett M. Leskowitz, Pasadena, both of Calif.

[73] Assignee: California Institute of Technology, Pasadena, Calif.

[21] Appl. No.: 08/872,528

[22] Filed: Jun. 11, 1997

Related U.S. Application Data

[60] Provisional application No. 60/019,573, Jun. 11, 1996.

[51] Int. Cl.[7] ........................................... G01V 3/00
[52] U.S. Cl. ................................................. 324/300
[58] Field of Search .................................... 324/300–322

[56] References Cited

U.S. PATENT DOCUMENTS

| | | | |
|---|---|---|---|
| 5,166,615 | 11/1992 | Sidles | 324/307 |
| 5,266,896 | 11/1993 | Rugar et al. | 324/307 |
| 5,397,987 | 3/1995 | Garritano | 324/307 |
| 5,629,624 | 5/1997 | Carlson et al. | 324/309 |

OTHER PUBLICATIONS

"Signal–To–Noise Ratios in Inductive & Mechanical Detection of Magnetic Resonance",John A. Sidles and Daniel Rugar, May 31, 1993, The American Physical Society (1993).

"Low–temperature Magnetic Resnance Force Detection", K. Wago et al., Jul. 25, 1995, American Vacuum Society (1996).

"Sub–surface Imaging with the Magnetic Resonance Force Microscope", P.C. Hammel, et al., Journal of Low Temperature Physics, vol. 101, Nos. 112, 1995.

"The Theory of Oscillator–Coupled Magnetic Resonance with Potential Applications to Molecular Imaging", John A. Sidles, et al., American Institute of Physics, 1992.

"First Images From a Magnetic Resonance Force Microscope", O. Zuger et al., American Institute of Physics, 1993.

"RMP Colloquia", J.A. Sidles, et al., Reviews of Modern Physics, vol. 67, No. 1, Jan. 1995.

"Force Detection and Imaging in Magnetic Resonance", Constantino S. Yannoni, et al., Almaden Research Center.

"Force Detection of Nuclear Magnetic Resonance", D. Rugar, et al., Science, vol. 264, Jun. 1994.

"Noninductive Detection of Single–Proton Magnetic Resonance", J.A. Sidles, American Institute of Physics Jan. 23, 1991.

Mechanical Detection of Magnetic Resonance, Rugar, C.S. et al., Letters To Nature Dec. 10, 1992.

*Primary Examiner*—Christine K. Oda
*Assistant Examiner*—Tiffany A. Fetzner
*Attorney, Agent, or Firm*—Fish & Richardson P.C.

[57] ABSTRACT

A system and method for force-detected NMR measurements by applying a spatially homogeneous field at a site of the sample. A composite magnet assembly is implemented to produce the homogeneous field and optimize the detection sensitivity.

77 Claims, 10 Drawing Sheets

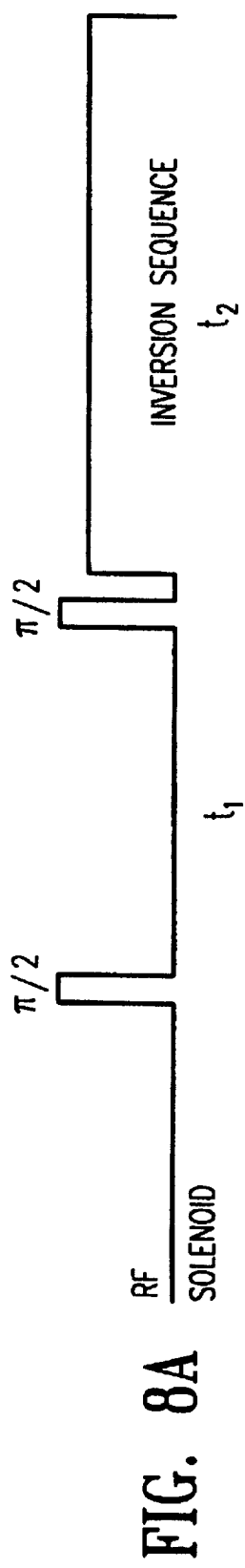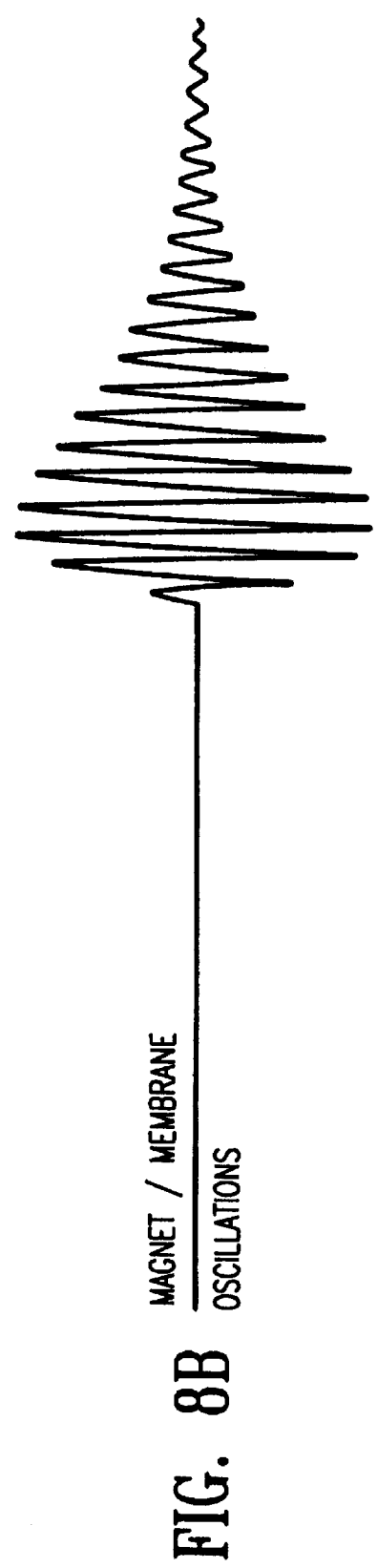
FIG. 8A
FIG. 8B

FORCE-DETECTED MAGNETIC RESONANCE INDEPENDENT OF FIELD GRADIENTS

RELATED PATENT APPLICATION

The present invention claims the benefit of the U.S. Provisional Application No. 60/019,573, filed on Jun. 11, 1996.

FIELD OF THE INVENTION

The invention relates to nuclear magnetic resonance, and more specifically to a detection method and system based on force-detected nuclear magnetic resonance.

BACKGROUND OF THE INVENTION

Nuclear magnetic resonance may be used to detect certain properties of a sample having atoms with nuclear magnetic moments associated with non-zero nuclear spins. In the absence of a magnetic field, the equilibrium orientations of these nuclear moments are random and the energies associated with different orientations of a nuclear moment are small. In the presence of a static magnetic field, that these nuclear magnetic moments assume certain allowed quantized orientations with respect to the static magnetic field. These quantized orientations give rise to distinct quantized energy levels known as nuclear Zeeman levels.

A transition, may be induced between two Zeeman levels by illuminating a sample with electromagnetic radiation in resonance with the transition between two Zeeman levels. The orientation of a nuclear moment can be changed by such a resonant excitation. This phenomenon is called nuclear magnetic resonance ("NMR"). In practical applications, the magnitude of the static magnetic field is usually within a range such that the energy separation between two adjacent nuclear Zeeman levels corresponds to the radio frequency ("rf") spectrum. Accordingly, a time-varying magnetic field for modulating the magnetization of a sample is within the rf range. Conventionally, the strength of the interaction between the applied rf field and the spin state of a sample is characterized by a Rabi frequency, which corresponds to the coupling energy.

Nuclear spins are intrinsic properties of atomic nuclei and can be used as part of noninvasive probes for analyzing many materials. Indeed, NMR spectroscopy and NMR imaging have been widely used to analyze the electronic and molecular structure, motion, and chemical composition of a sample.

Most of the existing NMR systems use two different types of configurations, magnetic induction detection and magnetic force detection. FIG. 1A shows a typical layout of a conventional magnetic induction NMR system. A sample 100 is placed in a spatially homogeneous static magnetic field $B_0$ which may be produced by one or more permanent magnets or an electromagnet. The magnetic field $B_0$ aligns the nuclear moments in the direction of the field $B_0$ and thus produces an initial magnetization of the sample 100. An rf excitation coil 110 is positioned near the sample 100 to produce an rf excitation field at the sample 100. The excitation coil 110 is configured to produce the rf excitation field with a varying magnetic field perpendicular to the magnetic field $B_0$. The rf excitation changes the initial magnetization of the sample 100 through the nuclear magnetic resonance and thereby induces an electromotive force ("emf") in a receiver coil 120 disposed near the sample 100. A current is thus generated by the Faraday induction in the receiver coil 120 and is subsequently processed as the NMR signal. In many cases, the excitation coil 110 may be the same as the receiver coil 120.

Another NMR configuration uses conventional force-detected NMR, which is in principle based on a magnetic force experienced by a magnet moment in a magnetic gradient field produced by an external magnet. The force-detected NMR can be viewed as a derivative of the well-known Stern-Gerlach force experiment in which the magnetic force on a spin magnetic dipole in a static magnetic field gradient is used to separate spin states in an atomic beam. Rabi et al., Physical Review, Vol. 53, p. 318, 1938. Similar to an induction NMR system, a rf excitation is applied to change the magnetization of a sample in the field of the external magnet in a force-detected NMR system. This in turn alters the magnetic force between the external magnet and the sample. The change in the magnetic force can be used to move a mechanical oscillator to which the sample or a sensing magnet is affixed. The position change of the oscillator is detected to produce an NMR signal by using a position sensor. The rf field modulates the magnetic force resonantly with the oscillator.

One type of conventional force-detected NMR systems is illustrated in FIG. 1B. See, Rugar et al., "Mechanical detection of magnetic resonance", Nature, vol. 360, pp. 563–566, Dec. 10, 1992; Rugar et al., "Force Detection of Nuclear Magnetic Resonance", Science, Vol. 264, pp. 1560–1563, Jun. 10, 1994; and Sidles et al., "Magnetic resonance force microscopy", Reviews of Modern Physics, Vol. 67, pp. 249–265, 1995. A sample 100 is fixed to the tip of a mechanical cantilever 130. This combination forms a mechanical oscillator. Unlike an induction NMR system, a gradient magnet 140 near the sample 100 produces a magnetic field gradient at the sample. This produces both a magnetization of the sample 100 and a magnetic force between the sample 100 and the gradient magnet. An rf excitation coil 110 located close to the sample 100 produces an rf field to modulate the magnetization of the sample 100. The position of the cantilever 130 moves as the magnetic force between the sample 100 and the gradient magnet 140 is modulated by cyclically modulating the magnetization in the sample 100 at the mechanical resonance frequency of the cantilever 130. A fiber optic sensor 150 can be used to detect this position change and produce an electrical NMR signal.

Specifically, Rugar et al. and Sidles et al. implement a cyclic adiabatic rapid passage (ARP) to invert the equilibrium longitudinal magnetization at the audio-frequency resonance of a sample-on-cantilever assembly. A ferromagnetic particle is used as the gradient magnet 140. The large magnetic field gradient is used both to provide the magnetic force, which couples longitudinal magnetization to cantilever motion, and to vary the resonance condition across the sample, which provides an imaging capability.

The force-detected NMR has been recognized to have several advantages over the induction NMR in certain applications. For example, the sensitivity of the force-detected NMR can be superior to that of the magnetic induction at small length scales and can be optimized to reach the thermal limit caused by the Brownian motion of the mechanical oscillator. Much of the interest in force-detected NMR is based on its potential for single-spin imaging which can provide a powerful alternative to induction NMR spectroscopy for determining molecular structures. This single-spin detection of the force-detected NMR if realized could be used to test single molecules and thereby the considerable work on time-consuming and costly sample preparation in the conventional NMR structural methods may be eliminated.

The conventional force-detected NMR using the sample-on-cantilever configuration (FIG. 1B) specifies a magnetic field gradient at the sample to produce the necessary magnetic force for coupling the rf energy supplied by the rf excitation coil to the oscillator. To increase the NMR signal strength, the static magnetic field needs to be large and the field gradient also needs to be large. In Rugar et. al., supra., the static magnetic field and the field gradient are typically on the order of several Tesla and several hundred Tesla per meter, respectively.

U.S. Pat. No. 5,166,615 to Sidles discloses several force-detected NMR configurations with a sample affixed onto a mechanical oscillator or vibrator. The external magnetic field applied to the sample has a gradient component. The patent states that the gradient component at the sample should be strong to enhance the spin-oscillator coupling.

Another type of the conventional force-detected NMR system places a sensing magnet on a mechanical oscillator. Similar to the aforementioned conventional force-detected NMR system, this system maintains a static magnetic field gradient at the sample to effect the magnetic force on the sensing magnet. See, for example, Zhang et al. in Applied Physics Letters, Vol. 68, pp. 2005 (1996), Smith et al. American Physical Society March Meeting Abstract, No. 19.07, 1997, and Sidles, Applied Physics Letters, Vol. 58, p. 2854 (1991).

Many practitioners in the field of NMR believe that a static magnetic field gradient at the site of a target sample is required for implementing the force detection. In particular, many have tried to improve the coupling between the nuclear spins of the sample and the mechanical oscillator by increasing the field gradient across the sample. See, for example, U.S. Pat. No. 5,166,615, supra. Hence, the magnetic field at the sample is highly inhomogeneous in conventional force-detected NMR systems. This field gradient at the sample can be limiting in several respects.

First, the variation of the magnetic field across the sample caused by the field inhomogeneity can effect spectral line broadening in the NMR signal. This is at least in part because the NMR signal corresponding to a particular transition is essentially a summation of signals of the entire sample and that transition has different frequencies at different locations in the sample. The larger the field gradient at the sample, the more the line broadening. This line broadening can significantly reduce the resolution of an NMR measurement of the conventional force-detected NMR systems. For example, some fine spectroscopic features, such as chemical shifts, spin-spin couplings, and chemical exchange effects in the NMR signal may become unresolvable due to this line broadening. Thus, field inhomogeneity at the sample is undesirable for NMR spectroscopy.

Secondly, the field inhomogeneity at the sample can reduce the coherence of the induced magnetization in the sample due to the spectral line broadening. This adverse effect can manifest itself in at least two different ways. The inventors of the present invention recognized that the magnitude of the magnetic force between the sample and the sensing magnet is proportional to the degree of coherence of the induced magnetization in the sample in addition to its linear dependence on the field gradient in prior force detection methods. Therefore, an increase in the field inhomogeneity can in fact decrease the net magnetic force. Hence, an increase in the magnetic force by increasing the field gradient is negated by the effect of the reduced coherence. Under certain conditions, increasing the field gradient at the sample to increase the detection sensitivity may actually reduce the detection sensitivity.

Another effect of the reduced coherence caused by the field inhomogeneity is that many well-developed NMR techniques may not be applicable in the conventional force-detected NMR system. This is at least in part due to the fact that many NMR spectroscopic and imaging techniques are primarily based on the coherence of the induced magnetization in the sample.

The inventors suggested that the inhomogeneous line broadening in the NMR signal may be overcome by arranging that the field gradient at the sample is turned off during the period when the spin evolution is encoded and turned on only during the subsequent detection process. See Leskokitz et al., Proceedings of the 36$^{th}$ Experimental NMR Conference, Boston, Mass., March 1995. This technique, however, does not solve the coherence problem during the detection period caused by the field gradient. The inhomogeneity at the sample makes contributions from different parts of the sample increasingly out of phase with respect to one another, thereby resulting in a decrease in the magnetic force.

In particular, in order to be near the optimum sensitivity for force detection on a given sample, the magnetic field strength due to the ferromagnetic particle alone may range across the sample from a maximum value comparable to that at the surface of the ferromagnet to a value of an order of magnitude or more smaller. This range, which usually is invariant to the length scale of the optimized sample-plus-particle, is of the order of 1 T or $10^7$ Hz in $^1$H Larmor frequency for the best ferromagnets. This is much greater than the maximum practical rf field strengths of about 10 mT, corresponding to ~$10^5$ Hz in terms of the proton Rabi frequency. The useful spectral range in various time-domain measurements is of the order of the Rabi frequency and often considerably less. Thus, the great majority of useful NMR detection methods, which are crucial to maximizing sensitivity, resolution, and information content, cannot be performed simultaneously over the entire sample volume by conventional force-detected NMR methods.

Note that this concern about loss of coherence control with inhomogeneous linewidths greater than ~$10^5$ Hz is quite distinct from the usual reasons for desiring homogenous magnetic fields (typically <<1 part per million) in high-resolution NMR. The goal of measuring fine spectroscopic features such as chemical shifts with resolution comparable to the homogeneous linewidth is the principal motivation for such highly homogeneous fields, and is neither more nor less important in the context of force-detected NMR methods.

The known reciprocal relationship between linewidth and sensitivity in directly-detected magnetic induction NMR measurements is absent in the force-detected NMR methods of the present invention. This is because modest field inhomogeneity can be made irrelevant to the signal power by utilizing a distinct detection period designed to prolong the decay of that magnetization which survives the evolution period of interest.

Consider a special case in which the longitudinal magnetization drives the mechanical oscillator at its resonance frequency $\omega_F$ as the result of cyclic adiabatic rapid passage ("ARP") repeated at $2\omega_F$ (Rugar et al., Science, Supra.). Ideally, ARP would be used to invert the magnetization thousands of times before spin relaxation erases memory of the initial magnetization, and indeed this has been demonstrated with ordinary spectral widths of less than 1 mT and, in the context of force-detected NMR, with gradient-induced spectral widths of several mT.

Large numbers of passes in a time duration short compared to the spin-lattice relaxation time ($T_1$) have not been demonstrated in the larger field gradients that are possible with optimized ferromagnets. But the question of whether it is practical can be answered by the following analysis. In order to prevent cancellation of forces associated with sample volume elements at different fields, the ARP should cover the entire range of Larmor frequencies in a time duration much shorter than, e.g., about one quarter of the oscillator period. This condition places a lower bound on the speed of a linear sweep, $d\omega_0/dt$, for a spectrum of width $\Delta$ and a given oscillator resonant frequency $\omega_F$:

$$\left|\frac{d\omega_0}{dt}\right| \gg 4\Delta \frac{\omega_F}{2\pi}. \quad (1)$$

Although the lowest practical value of $\omega_F$ is not clear, with the audio-frequency values that have been achieved to date, this will typically be a stricter lower bound than results from demanding that the sweep be completed in a time duration that is short compared to a rotating-frame spin-relaxation time, $T_{1\rho}$. An upper bound on the sweep rate is set by the adiabatic condition, $$\left|\frac{d\omega_0}{dt}\right| \ll \omega_1^2, \quad (2)$$

where $\omega_1$ is the Rabi frequency. Condition (2) insures that the magnetization is not irreversibly dephased during ARP. Conditions (1) and (2) place a lower bound on the Rabi frequency:

$$\omega_1 \gg \sqrt{4\Delta\omega_F/2\pi}. \quad (3)$$

With $\Delta=2\pi\times(10 \text{ MHZ})$, and $\omega_F=2\pi\times(500 \text{ Hz})$, ARP with small dissipation of spin order would require a Rabi frequency in excess of 100 kHz. Such a high Rabi frequency may be possible, but technical problems such as sample heating can render it undesirable. Systems with molecular motion comparable to the Rabi frequency can suffer greater magnetization decay during ARP than when the magnetization is longitudinal ($T_{1\rho} \ll T_1$). Thus, it can be concluded that the desirable goal of inverting the magnetization by ARP many times in a time much shorter than $T_1$ can be difficult or impractical for many systems and is made more difficult by the presence of the largest average field gradients that are possible for a given sample.

An alternative to ARP is a train of $\pi$ pulses, preferably compensated to provide accurate inversion in the presence of rf inhomogeneity and other spin interactions. In the absence of a static field gradient, this would allow a square-wave modulation of the average value of the magnetization, $<M_z(t)>$, at the audio frequency of the mechanical oscillator with a modest Rabi frequency and rf duty cycle. A gradient-induced spectral width far in excess of the Rabi frequency would make such an approach ineffective. Thus this approach is not feasible in the context of previously described force-detected NMR methods, unless sensitivity is compromised by designing for far less than the largest possible force.

Homogeneity in a static magnetic field is desirable during the period in which the oscillator is being driven in proportion to $<M_z(t)>$ also because this would allow real-time detection of these transients. Such real-time detection of force-detected NMR may be preferred in cases where it is desirable to achieve higher throughput at the cost of reduced sensitivity. Multiple-pulse sequences may be used to achieve an effective Hamiltonian that does not commute with $M_z$ and has an audio-frequency spectrum, thus allowing spectral information to be obtained by Fourier transformation of $<M_z(t)>$. The argument here parallels that in ordinary NMR where pulsed spin-locking during detection is usually the strategy that optimizes sensitivity, but requires extending the dimensionality of the time domain experiment by one. The reduction in the detection sensitivity is minimized when the NMR spectrum has multiple resolved lines and is maximal when the effective Hamiltonians provide few resolved transitions and decay is much shorter than the decay time possible in an optimized detection period.

SUMMARY OF THE INVENTION

The present disclosure describes in general a method and an NMR system that combine the sensitivity advantage of the force detection NMR with the full array of NMR spectroscopy and imaging methods based on a spatially homogeneous static magnetic field across a target sample.

According to one embodiment, a composite magnet assembly is configured to produce a spatially homogeneous static field at the sample at all times, but has a soft distortion mode that may be resonantly driven by a magnetic force on a sensing magnet in the magnet assembly that is produced by the spins in the sample. Since the static field gradient at the sample is essentially eliminated at all times, the difficulties associated with such gradients in the conventional force-detected NMR systems can be obviated, with little or no compromise in the detection sensitivity. Both resolution and sensitivity in the NMR detection can be significantly improved compared to prior-art force-detection and inductive detection methods.

The method and system of the invention may be generally applicable with respect to sample composition, pulse sequence, and magnetic field strength. Advantages of sensitivity, portability, and cost stem from the small instrument volume and mass and promise to extend the use of NMR to new applications and environments.

BRIEF DESCRIPTION OF THE DRAWINGS

These and other features and advantages will become more apparent in light of the following detailed description of the invention, as illustrated in the accompanying drawings, in which:

FIG. 8A shows a two-pulse sequence for encoding and detection that can be used in the force-detected NMR of the invention. FIG. 8B shows the mechanical oscillation of an oscillator in the NMR system of the invention based on an rf excitation of FIG. 8A.

DETAILED DESCRIPTION OF THE INVENTION

Figure 1A:
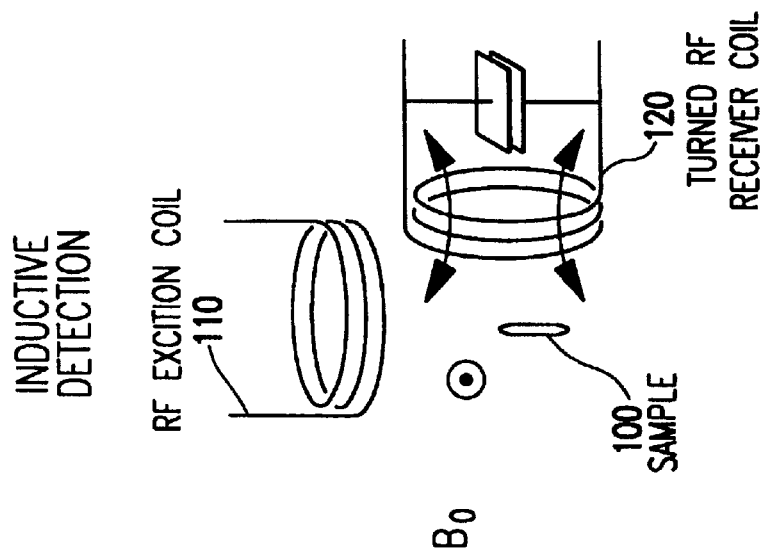
FIG. 1A is a schematic illustration showing a typical prior-art magnetic induction NMR configuration.
Figure 1B:
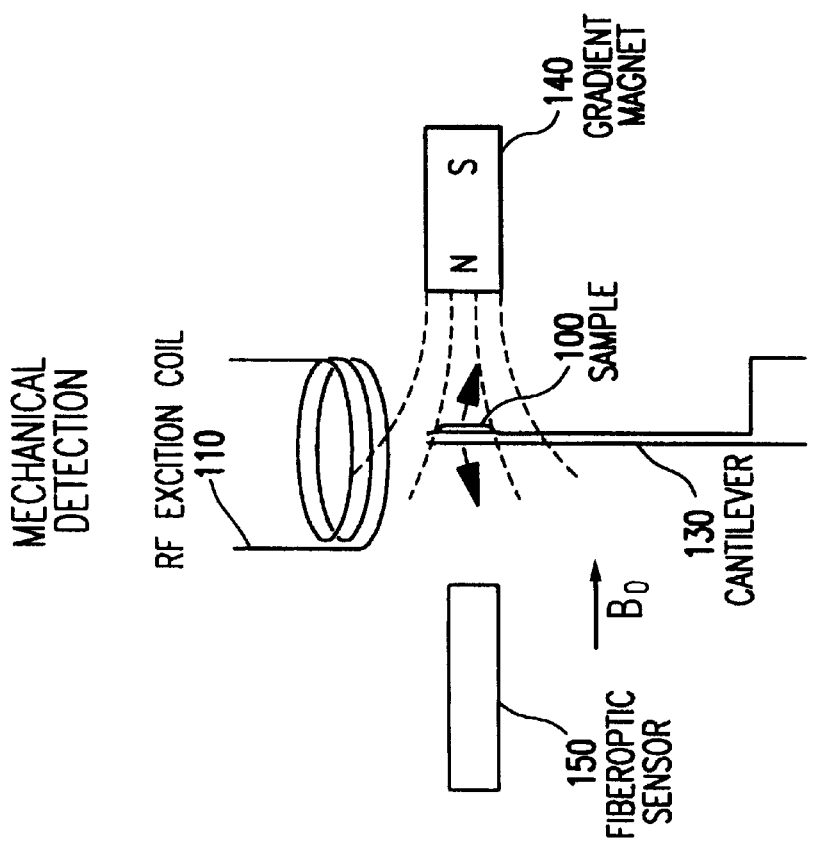
FIG. 1B is a schematic illustration showing a typical prior-art magnetic force detection NMR configuration.

Force Detection: Homogeneous Static Field at Sample

The energy of interaction of two point magnetic dipoles $\mu_s$ and $\mu_d$ separated by a distance r can be expressed as $$E = -\frac{\mu_0}{4\pi r^3}[3(\mu_s \cdot \hat{r})(\hat{r} \cdot \mu_d) - \mu_s \cdot \mu_d] \quad (4a)$$

$$= -\mu_s \cdot \left[\frac{\mu_0}{4\pi r^3}(3\hat{r}\hat{r} - 1)\right] \cdot \mu_{d'} \quad (4b)$$

where $$\hat{r} = \frac{(r_d - r_s)}{|r_d - r_s|} \quad (5)$$

is a unit vector pointing from the position ($r_s$) of $\mu_s$ to that ($r_d$) of $\mu_d$ and $\mu_0$ is the vacuum permeability constant. The dyadic notation (4b) is compact and shows the essential symmetry of the interaction. The magnetic field generated by a sample dipole $\mu_s$ situated at the origin, expressed in the spherical coordinates defined in FIG. 2, can be written as $$B_s(r) = \frac{\mu_0|\mu_s|}{4\pi r^3}(2\cos\theta\hat{r} + \sin\theta\hat{\theta}) \quad (6a)$$

$$= \frac{\mu_0}{4\pi r^3}\mu_s \cdot (3\hat{r}\hat{r} - 1) \quad (6b)$$

$$= \frac{\mu_0}{4\pi r^3}\mu_s \cdot (3\hat{r}\hat{r} - 1) \cdot \mu_{s'} \quad (6c)$$

with an analogous expression for $B_d$ when the position of the detector dipole is chosen as the origin. Thus, the energy may be rewritten in terms of the moment of either dipole in the field of the other as $$E = -\mu_s \cdot B_d(r_s - r_d) = -\mu_d \cdot B_s(r_d - r_s). \quad (7)$$

The force on a dipole is $F = -\nabla E$, the negative of the derivative of the total potential energy with respect to a spatial coordinate r. In particular, the force exerted on a dipole $\mu$ in a field B (e.g., of another dipole) can be represented by the following Cartesian components:

$$F_i = \sum_{j=x,y,z} \mu_j \frac{\partial B_i}{\partial j} = \sum_{j=x,y,z} \mu_j G_{ij}. \quad (8)$$

The tensorial field G represents the gradient of the field B. From equation (7), clearly $\partial E/\partial r_s = -\partial E/\partial r_d$, so that the force between two magnetic dipoles satisfies Newton's third law, that is the mutual forces are equal in magnitude and opposite in direction. The superposition principle of magnetostatics ensures that the reciprocity relation in Newton's third law is also true for magnetized bodies of finite size.

The inventors of the present invention discovered that an "inverse" Stern-Gerlach force exerted on magnetic dipoles of known magnitude and direction in the gradient field of the sample's nuclear magnetization can be used for force detection NMR measurements. The field gradient at the sample, which is present in a conventional force-detected NMR system, is no longer necessary according to the present invention. Furthermore, the inventors of the invention discovered that the field gradient at the sample is generally undesirable in a force-detected NMR system and should preferably be minimized in many NMR measurements. A desired homogenous static magnetic field can thus be maintained at the site of the sample at all desired times in the force detection. This aspect of the invention obviates the problems associated with the field inhomogeneity at the sample in conventional force-detected NMR systems.

Figure 3:
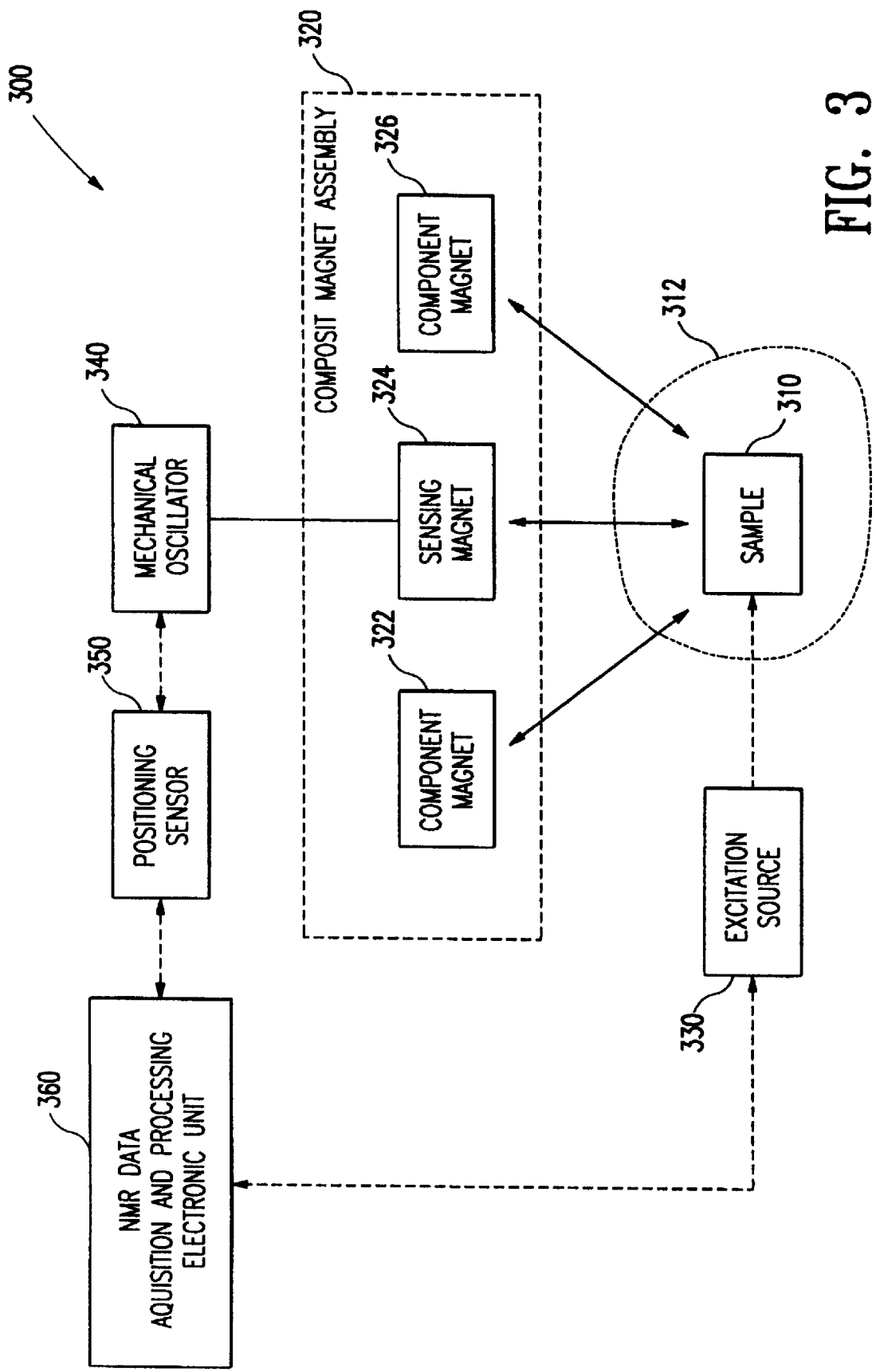
FIG. 3 is a block diagram illustrating one embodiment of the force-detected NMR system of the present invention.

FIG. 3 shows a block diagram of an embodiment 300 of the force-detected NMR system of the present invention. A composite magnet assembly 320 has a plurality of component magnets 322, 324, and 326 distributed in a prespecified geometry with respect to a location 312 for placing a sample 310 and produces a static magnetic field. The composite magnet assembly 320 and the sample 310 are arranged with respect to each other so that the static magnetic field at the site of the sample is substantially homogeneous. The homogeneity for the static magnetic field may be characterized by the line broadening caused by the field inhomogeneity. According to the invention, the line broadening caused by the inhomogeneity is preferably smaller than the Rabi frequency. More preferably, a relative variation in the field magnitude across the sample 310 is approximately about 1 part per million or less. Under such a preferred homogenous condition, the total magnetic force exerted on the sample 310 by the magnet assembly 320 as a whole is substantially zero. According to Newton's third law, the "inverse" magnetic force exerted on the composite magnet assembly 320 as a whole by the sample 310 is also substantially zero.

The inventors recognized that, although the net magnetic force exerted on the magnet assembly by the sample is substantially zero, an individual magnet in the magnet assembly may experience a non-zero force induced by the field gradient produced by the magnetization of the sample. The field gradient of the sample may measurably distort the composite magnet assembly as a whole by spatially moving the component magnets relative to one another. According to the present invention, this unique configuration can be accomplished for a given sample by choosing the desired geometrical and magnetic properties of the magnet assembly and the induced magnetization profile of the sample.

According to the invention, one or more component magnets in the magnet assembly may be used as sensing magnets to detect the magnetization of the sample. A component magnet in the magnet assembly that is closest to the sample may be preferably chosen for detection in order to increase the detection sensitivity. A component magnet 324 in FIG. 3 is shown as one sensing magnet. In certain cases, the size of a sensing magnet may be made similar to that of the sample. The position of a sensing magnet can be moved by the magnetic force exerted by the sample. As the magnetization of the sample changes, the magnetic force on a sensing magnet changes accordingly, so does the position of the sensing magnet. Therefore, the positioning information of a sensing magnet has a correlation with the magnetization of the sample. This constitutes one essential element for the force-detected NMR measurements of the present invention. The position of a sensing magnet in response to the modulation of the magnetization of the sample by the rf excitation field, is extracted to produce the NMR signal.

In the embodiment shown in FIG. 3, the sensing magnet 324 in the magnet assembly 320 is mechanically coupled to a mechanical oscillator 340 with a high quality factor $Q_F$ and a resonance frequency $\omega_F$. The nonmagnetic mass of the mechanical oscillator 340 can be minimized to enhance the detection sensitivity. The mass of the sensing magnet 324 affixed onto the oscillator 340, however, can be configured to be an optimal mass for maximizing the sensitivity. Two seemingly competing effects may be included in the determination of the optimal mass for the sensing magnet. On one hand, the smaller the total mass of the oscillator and the sensing magnet, the more sensitive is the amplitude of the motion of the oscillator in response to a given force. This indicates that the mass of the sensing should be reduced. On the other hand, the magnetic force on the sensing magnet increases with the magnet size for a given gradient field of the sample because the magnetic coupling between the sample's gradient field and the sensing magnet increases with the magnet size. However, the mass of the sensing magnet increases with its size. Therefore, the optimal mass for the sensing magnet is determined by balancing these two effects to achieve a maximal detection sensitivity. In addition, the geometry of the sensing magnet with respect to the force of the magnetic field of the given sample may also be considered in maximizing the sensitivity.

An excitation source 330 can be used to produce a time-varying magnetic field at the sample to modulate the magnetization of the sample. In many practical applications, this excitation source is an rf source. The modulation of the magnetization by the rf can be converted into the mechanical oscillation of the oscillator whose frequency is usually in the audio-frequency range. The modulation by the rf may be chosen so that the induced oscillation of the oscillator is near or at the resonance frequency $\omega_F$. This condition is preferred in order to increase the detection sensitivity.

The excitation source 330 as shown in FIG. 3 is a separate element from the composite magnet assembly. Alternatively, the excitation source and the composite magnet assembly may be integrated together as one unit to generate both the homogeneous static magnetic field and the time-varying excitation field at the sample. In addition, the composite magnet assembly may include at least one electromagnet component magnet for producing the spatially homogeneous magnetic field at the sample with other component magnets. The electromagnet component magnet can be used to change the magnitude or direction of the spatially homogeneous magnetic field at the sample in some operations such as modulating the magnetic force on a sensing magnet at a resonance frequency of the mechanical oscillator.

A positioning sensor 350 is used to accurately measure the position change of the oscillator, which is processed to generate an NMR signal. As previously described, the time evolution of the oscillator's position is determined by the magnetization of the sample. The modulation of the sample magnetization can be represented by the AC component of the position deflection at the resonance frequency $\omega_F$ effected by the magnetic force exerted on the sensing magnet. The amplitude of the AC deflection is proportional to the magnitude of the magnetization in the sample. The DC component of the position deflection is usually present merely as a bias.

Alternatively, the NMR signal detection can be implemented by a feedback scheme. An electrically-controllable positioning actuator (e.g., a piezo actuator) can be used to cancel the movement of the oscillator due to the magnetic force exerted on the sensing magnet. Alternatively, additional controlled forces (e.g. coulombic or magnetic) could be applied to the oscillator to cancel the NMR related force. Hence, the positions of the oscillator and the sensing magnet remain substantially unchanged from their equilibrium position. An electrical feedback mechanism is used to feed back an AC signal to control the positioning actuator, canceling the AC deflection. The amplitude of the AC feedback signal can be used to extract the sample magnetization. See, for example, Mertz et al, Applied Physics Letters, Vol. 62, p. 2344, 1993 and McCombie, Rep. Prog. Phys., Vol. 16, p. 266, 1953, which are incorporated herein by reference. This feedback NMR detection scheme may have advantages in some applications over the direct detection of the oscillator positioning. For example, the linearity of the oscillator can be better maintained since the displacement of the oscillator is very small. Also, the homogeneity of the static field across the sample affixed on the oscillator can be better maintained due to the small displacement.

The data acquisition and processing are controlled and performed by an electronic unit 360. As shown in FIG. 3, the electronic unit 360 also controls the rf excitation source to modulate the magnetization of the sample in a desired mode. For example, a pulsed modulation with a certain pulse sequence may be generated and a Fourier transform may be performed by the electronic unit to extract an NMR frequency spectrum of the sample. The electronic unit may also control certain aspects of the composite magnet assembly such as the magnitude of the static magnetic field at the sample, the equilibrium position of the sensor magnet(s), currents in field-shimming coils placed near the sample, etc.

Various devices may be used to implement the force-detected NMR system 300 of FIG. 3. A magnet in the composite magnet assembly can be a permanent magnet made of a ferromagnetic material, an electromagnet or a combination thereof. A ferromagnetic magnet may be preferred as a sensing magnet in some cases. The mechanical oscillator may be any type of micro-mechanical oscillator such as a silicon membrane or cantilever. The positioning sensor may be an optic fiber interferometric sensor, an electron tunneling sensor, a piezoresistive sensor, or a capacitive sensor. The rf excitation source may be an rf coil. The electronic unit may include a microprocessor.

As described earlier, the configuration of the composite magnet assembly is at least in part dependent on the geometry of a target sample. Many aspects of the invention may be exemplified by a special force-detected NMR system designed for a sphere-shaped sample based on the embodiment of FIG. 3. This special system is described as follows.

Figure 2:
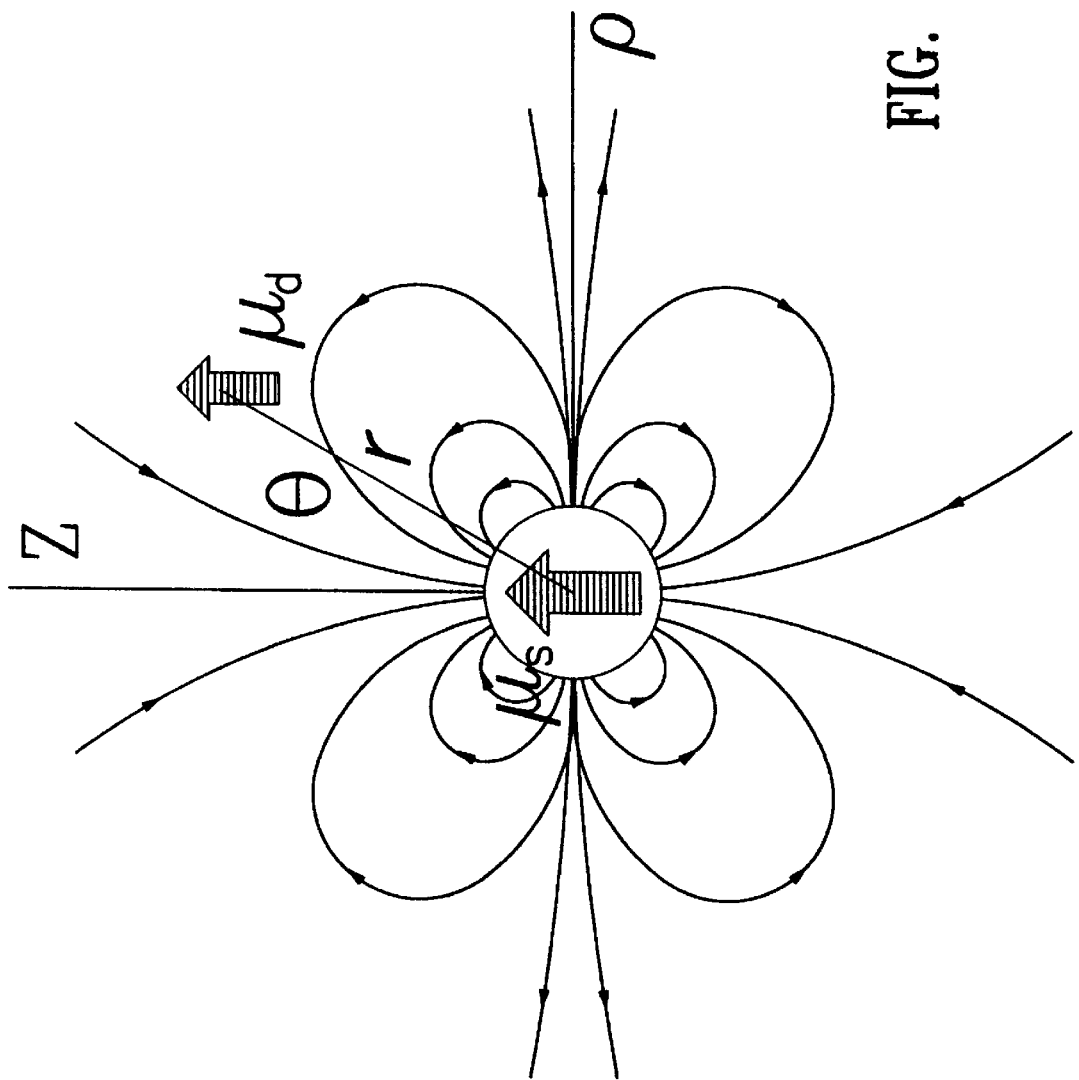
FIG. 2 is a diagram illustrating interaction of a sample magnetic dipole and a sensor magnetic dipole, wherein the sensor magnetic dipole is aligned along the z-axis and situated near the sample magnetic dipole.

It is assumed that the sample is a sphere of radius $R_s$ with uniform composition of a paramagnetic material. In a homogeneous external static magnetic field, the sample is uniformly magnetized. The exterior field produced by such a magnetized spherical sample is identical to that of a point magnetic dipole=$MV\mu_s$ located at the center of the spherical sample where M is the sample's magnetization and V is its volume. If a ferromagnetic sensing magnet can be represented by a sensing dipole $\mu_d$, the interaction of two magnetic dipoles in FIG. 2 may be used here. The magnetic force on the sensing dipole $\mu_d$ aligned along the z-axis and located at an arbitrary position r in the field of the sample dipole $\mu_s$ can be expressed as $$F = \mu_d \cdot G_s \qquad (9)$$

$$= \frac{\mu_0}{4\pi} \frac{\mu_s \mu_d}{r^4} [\cos\theta(9 - 15\cos^2\theta)\hat{z} + \sin\theta(3 - 15\cos^2\theta)\hat{\rho}],$$

where $G_s$ is the gradient tensor produced by the sample dipole. FIG. 2 shows the spatially varying force of the magnetic field produced by the sample dipole on test dipoles aligned along the z-axis. The field distribution suggests a variety of flexible, magnetized detectors that could be measurably distorted in the target sample's field. More generally, the optimized detector for a given sample usually depends on the shape of the sample and the magnetization profile that might be imposed on the sample by the external field which is a summation of the static field and the rf field in a NMR system or might arise from the structure of the sample.

For the uniformly-magnetized spherical sample, the total magnetic force between sample and surroundings is obtained by integrating Equation (9) over the surroundings. If, as is desirable for spectroscopy, the composite magnet assembly (FIG. 3) is designed for field homogeneity over the sample, then by Newton's third law there will be no net force between the sample and the magnet assembly as a whole. However, the inventors recognized that one or more selected sensing magnets can still experience a magnetic force generated by the field gradient of the sample. The force exerted on the rest of the magnet assembly by the field gradient of the sample can be opposite to the forces on the sensing magnets.

Figure 4A:
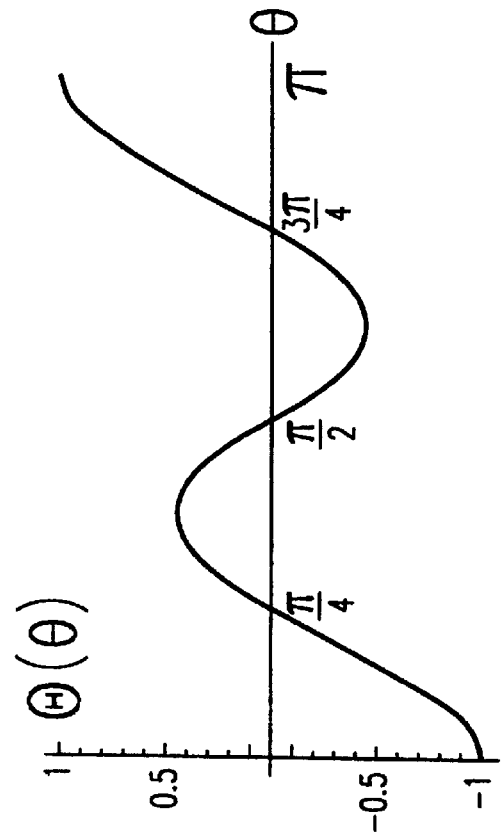
FIG. 4A is a chart showing the magnetic force along the z-axis as a function of the polar angle $\theta$ shown in FIG. 2.

An analysis of the spatial dependence of the magnetic force on dipoles in the surroundings by the spherical sample shows how one may optimize a sensing magnet-as-oscillator design in order to obtain the maximum sensitivity to the average nuclear magnetization of this sphere. The spatial distribution of the z-component of the field gradient tensor of the spherical sample is shown in FIG. 2. The spatial dependence of the force on a sensing dipole along the z-direction is represented by Equation (9). One aspect of this spatial dependence is the angular dependence on the position angle θ. FIG. 4A shows the force as a function of θ for a fixed radius r from the center of the spherical sample. The force changes in its direction and magnitude with θ.

Figure 4B:
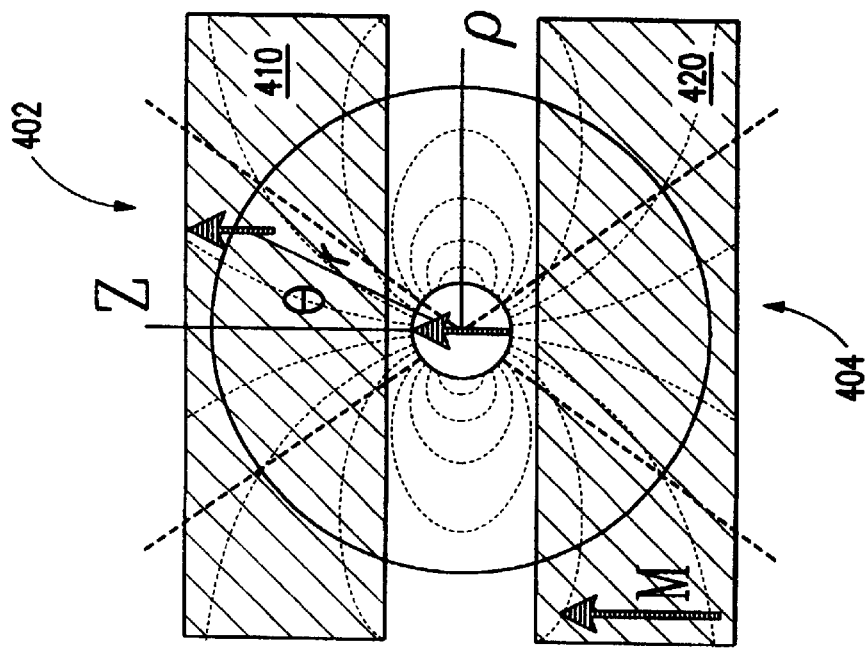
FIG. 4B is a schematic diagram illustrating regions near a spherical, magnetic sample where sensor magnets may be placed in embodiments of the invention.

FIG. 4B indicates that two conical regions symmetrically located along the z-axis with respect to the center of the spherical sample may be preferred for disposing one or more sensing magnets. The boundaries of the cones are defined by surfaces having an angle $\theta_0$ with respect to the z-axis given by:

$$\theta_0 = \arccos(\sqrt{3/5}) \approx 39.2°.$$

As shown in FIG. 4A, for the z-component of the force within the upper cone is always pointed to the negative z-direction and the z-component of the force $F_z$ with the lower cone is always pointed to the positive z-direction. In particular, the magnitude of the z-component decreases from a maximum value to zero as the angle θ increases from zero to $\theta_0$. Thus, the boundaries of the cones are crossing points at which the z-component flips its direction. The z-component vanishes on the boundaries defined by the angle $\theta_0$. The regions outside the cones may also be used for detection with a reduced sensitivity since the maximum magnitude of the z-component of the force $F_z$ is smaller.

FIG. 4B illustrates the two conical regions 402 and 404 which are indicated by the dotted straight lines with the angle $\theta_0$. The two blocks 410 and 420 represent the component magnets in the composite magnet assembly for producing a homogeneous field at the spherical sample. According to the invention, a magnet assembly design optimized for a spherical sample may preferably have a harmonically bound magnet as a sensing magnet that is located within the conical regions. More preferably, the sensing magnet may have the shape of a truncated cone whose boundaries are within, but substantially close to, the conical surfaces with an angle of $\theta_0$. The relevant sample-dependent driving force may be found by integrating Equation (9) over that sensing magnet material which is part of a mechanical oscillator. From another point of view, for a given instantaneous value of the nuclear magnetization, this force is the same in magnitude but oppositely directed as a force that would be exerted on the sample, in the hypothetical absence of the static component magnets of the composite assembly, due to the gradient of the moving magnet at the sample.

For better overall sensitivity, and for more uniform sensitivity over the sample volume, the distribution of moveable magnetic material in the composite magnet assembly may be more uniform around the sample. For example, two sensing magnets that are mechanically coupled to oscillators may be symmetrically located on the z-axis with respect to the center of the sample, one above and one below the sample in the conical regions as shown in FIG. 4B. This configuration may be used to increase the proportion of the signal field that is sampled by the detection system. Furthermore, as can be appreciated from the force lines of FIG. 2, magnetic material surrounding the sample in the x-y plane and moving radially relative to the center of the sample may be used to further improve the sensitivity and the uniformity of the response to different volume elements of the sample.

Figure 5:
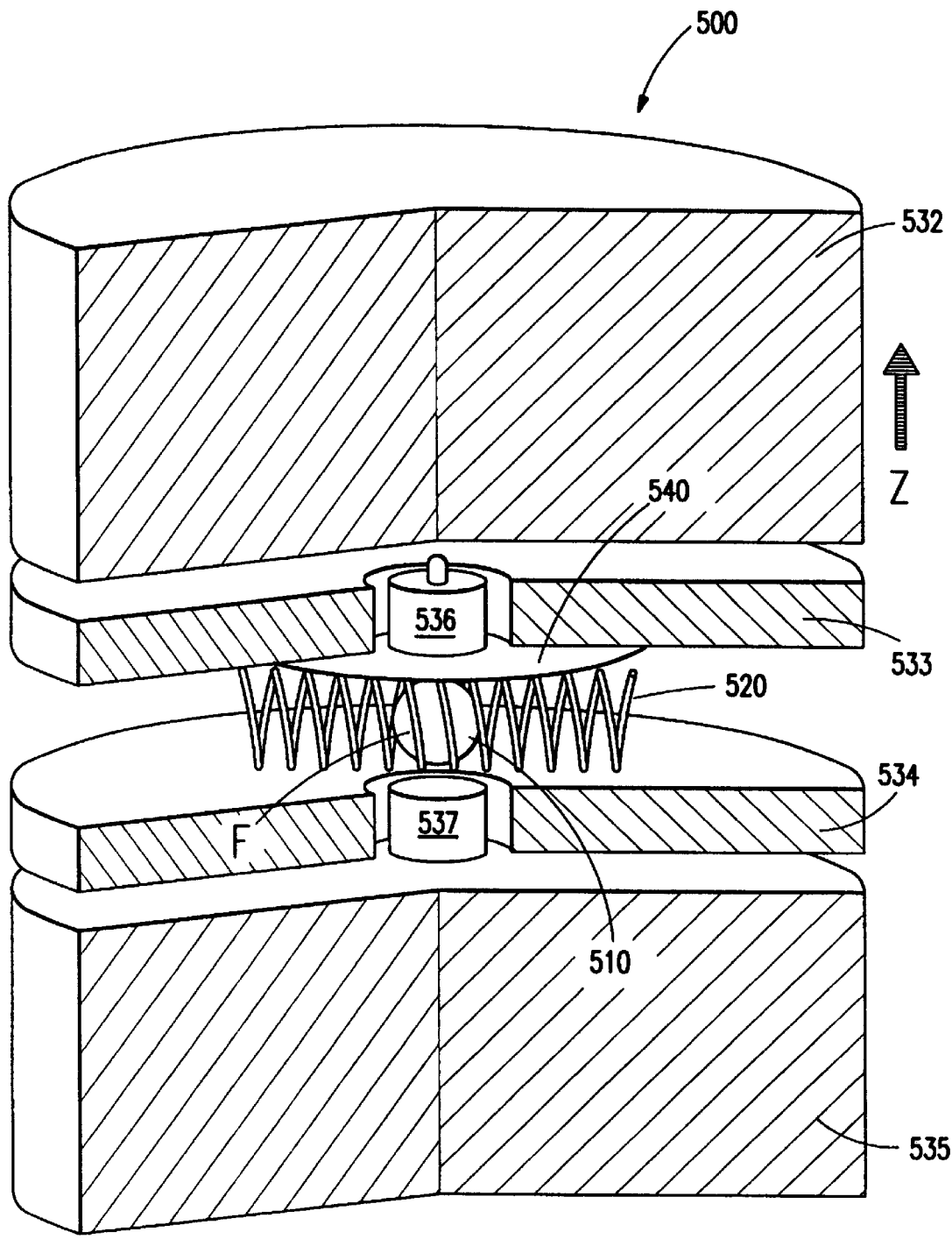
FIG. 5 is a schematic diagram showing one embodiment of the force-detected NMR system of the invention.

FIG. 5 shows one embodiment 500 of a force-detected NMR system for a spherical sample 510 in accordance with the invention. This embodiment implements a single sensing magnet-oscillator. Only a part of the components are shown for sake of simplicity. The spherical sample 510 is held by a sample holder (not shown) and located within a Rf excitation coil 520 which modulates the magnetization of the sample. Alternatively, the sample 510 and the coil 520 may be separated but closely located with each other. A composite magnet assembly 530 is symmetric about the sample 510 and is configured to have a space for accommodating the sample holder and the Rf coil.

In this embodiment, the magnet assembly 530 includes two outer ferromagnetic disks 532 and 535 and two inner ferromagnetic disks 533 and 534. These ferromagnetic disks are arranged to be coaxial with each other and have aligned axial magnetic moments (e.g., in the z-direction as indicated). A central portion of at least one of the inner disks 533 and 534 nearest to the sample 510 is a separate piece of ferromagnetic material mounted so that its motion along the z-axis is weakly bound. In FIG. 5, the two inner disks 533 and 534 each have a cut-out cylindrical magnet, 536 and 537, respectively. Referring back to FIG. 4B, both magnets 536 and 537 should be sized to be within the conical surfaces defined by the conical angle $\theta_0 \approx 39.2°$. Alternatively, the magnets 536 and 537 may have tapered side shape conformal to the conical surfaces. In addition, the dimension of the magnets 536 and 537 may be similar to the dimension of the sample 510 to achieve a better coupling efficiency. Also, the outer magnetic disks 532 and 535 may be electromagnets so that the total magnetic field by the composite magnet assembly 530 may be electrically controlled.

The composite magnet assembly 530 is preferably configured so that the static magnetic fields produced by the magnets 532, 535, 533, 534, 536, and 537 produce a substantially homogeneous static magnetic field in the region surrounding the sample 510. Hence, the net static field of the composite magnet assembly 530 at the site of the sample 510 has a field gradient that is substantially zero. The magnetization of the sample produces a magnetic field gradient which applies a force on the magnets 536 and 537.

At least one of the magnets 536 and 537 can be used as a sensing magnet for NMR measurements. FIG. 5 shows that the magnet 536 is attached to an oscillator 540 to form an NMR sensor. The oscillator 540 can be made of a material with low elastic dissipation (e.g. silicon). Specifically, the oscillator 540 can be designed so that the structure of the sensing magnet 536 and the oscillator 540 has a resonance frequency $\omega_F$ in the audio range with a quality factor $Q_F \gg 1$ (i.e., minimal energy dissipation). The design consideration of the oscillator 540 may include the geometry of the sensing magnet 536 and the oscillator and all the forces on the oscillator 540 including the magnetic, electrical, mechanical, and gravitational forces. It is desirable that the mass of the oscillator itself is much smaller than the mass of the sensing magnet affixed thereon so that the motional mass of the sensing magnet-oscillator assembly is dominated by the mass of the sensing magnet. The configuration of the oscillator should also be included in designing the composite magnet assembly for optimizing homogeneity and sensitivity. At an equilibrium position of the oscillator 540, the sum of magnetic forces between the sample and all the magnets together is nominally zero, because the field of the magnet array is homogeneous over the sample. More precisely, this is the case in the limit of vanishing nuclear magnetization, which is excluded from the definition of the equilibrium forces, since it is modulated during detection when the only appreciable motion need occur.

The embodiment of FIG. 5 is constrained to maintain geometrical simplicity for ease of manufacture and good field homogeneity. The distance $R_{max}$ between the center of the sample 510 and the near surface of the ferromagnetic oscillator 540 may be adjusted so that the sample radius $R_s$ constitutes a major part but also includes space for the oscillator 540 and any other barriers (not drawn) that might be desirable to allow the sample and oscillator to be at different temperatures or pressures. Given $R_{max}$, the cylindrical shape and size of the oscillating sensor magnet 536 can be optimized to give a maximal sensitivity at the center of the spherical sample 510, which is located in the region of greatest field homogeneity. This also results in the best sensitivity averaged over other spherical samples centered at this position with different radii.

An important design issue is achieving an audio frequency mechanical oscillation in the presence of the large static magnetic forces between the sensor magnet 536 and the other ferromagnetic material in the composite magnet assembly 530. The magnetic potential for z-axis motion of the sensing magnet 536 is an unstable equilibrium (i.e., top of a potential hill). This potential curvature can be canceled out and turned into a weakly bound potential minimum by attaching the sensor magnet 536 to the mechanical oscillator 540.

The oscillator 540 shown in FIG. 5 is a thin membrane that is attached outside the cut-out hole in the center of the ferromagnetic disk 533 or in some other way to allow its center 536 is fixed to the center of the membrane oscillator 540. The to oscillate in the z direction. The sensing magnet (fundamental) "drumhead" mode of the loaded membrane can be coarsely tuned to the audio region by varying the dimensions of the membrane. The exact frequency may be unimportant, since the frequency of spin inversion can be adjusted to provide resonant driving. The attachment of the sensor magnet 536 to the membrane 540 also suppresses the rotations and transverse displacements of the magnet 536. The partial cancellation of curvature in the potential for oscillator motion is useful in that it allows an audio-frequency $\omega_F$ without an unduly fragile silicon suspension.

The position of the oscillator 540 can be detected with a displacement sensor that contributes negligible noise, thus allowing an accuracy limited by the thermal Brownian motion.

A number of modulation techniques may be used to modulate the spin magnetization of the sample so that the magnetic force by the gradient field on the sensing magnet drives the oscillator near or at the resonance frequency $\omega_F$. The homogeneous polarizing magnetic field or the phase, magnitude, and frequency of the time-varying excitation field may be modulated. A modulation technique should preferably produce in the force a frequency component near or at the resonance frequency OF of the oscillator for an optimal detection sensitivity. Thus, the modulation frequency or its harmonic frequencies may be configured at or near the resonance frequency $\omega_F$ to drive the oscillator.

Configuration of Composite Magnet Assembly

The configuration of the composite magnet assembly in accordance with the embodiment produces a spatially homogeneous magnetic field at the sample and provides one or more weakly bound oscillating sensing magnets for detecting the NMR signal. Some aspects in designing the composite magnet assembly are analogous to, but different from, the considerable activity in the field of inductive NMR detection in which a variety of rf cavities and coil arrangements are used to optimize the NMR detection for different samples. In the present invention, a sample magnetization profile can be predetermined to at least approximately represent the actual magnetization profile of a given anticipated type of sample that is polarized in a spatially homogeneous magnetic field. The predetermined magnetization profile may be uniform or non-uniform depending on the characteristics of the given type of sample. The choice of sufficiently strong uniform magnetization, as in the previously described example of a roughly spherical sample, is only one possibility, which is convenient since it arises from the polarizing effect of a sufficiently strong uniform field. In general, methods for using field gradients of static or rf fields to establish nonequilibrium magnetization profiles are well-established in the art. These methods are typically characterized by periodic variation in the direction of longitudinal magnetization in a direction and with a period that is controllable.

In a design method of the present invention, Equation (9) can be used to compute the expected tensorial gradient field $G_s$ of the sample nuclear magnetization throughout the space surrounding the sample by a spatial integration over the sample volume. One may imagine that the space in the gradient field $G_s$ around the sample is filled with little volume elements dV of magnetic sensor material polarized in a given (and possibly spatially varying) direction, ê. The product of êdV with $G_s$ is a force field F that, at each point, defines the direction and magnitude of the force experienced by the magnetized volume element in the sample's gradient field $G_s$ when the sample's magnetization substantially matches the predetermined magnetization profile. The calculations involve standard magnetostatics and can be readily performed on a computer. The magnitude (and possibly or necessarily also the direction) of the sample's magnetization can be modulated during a detection period. The force field F is thus modulated by the detection process. This vector-field picture of the forces allows flexibility in design and placement of one or an array of sensing magnets in the composite magnet assembly. The mechanical response of a sensing magnet to the field of force is along the direction of the forces at each point in the field calculated above. In the embodiment based on a spherical sample, for example, magnetic material in the conical regions along the z-axis (FIG. 4b) is forced in directions opposite to that of the magnetic material in the radially more distant regions.

The uniform magnetization profile based on a spherical sample can be used to approximately represent samples with geometries other than a sphere as long as the dimension in any direction is not substantially smaller than other dimensions. For example, a cubic sample may well be used in a composite magnet assembly designed for a spherical sample.

Figure 6A:
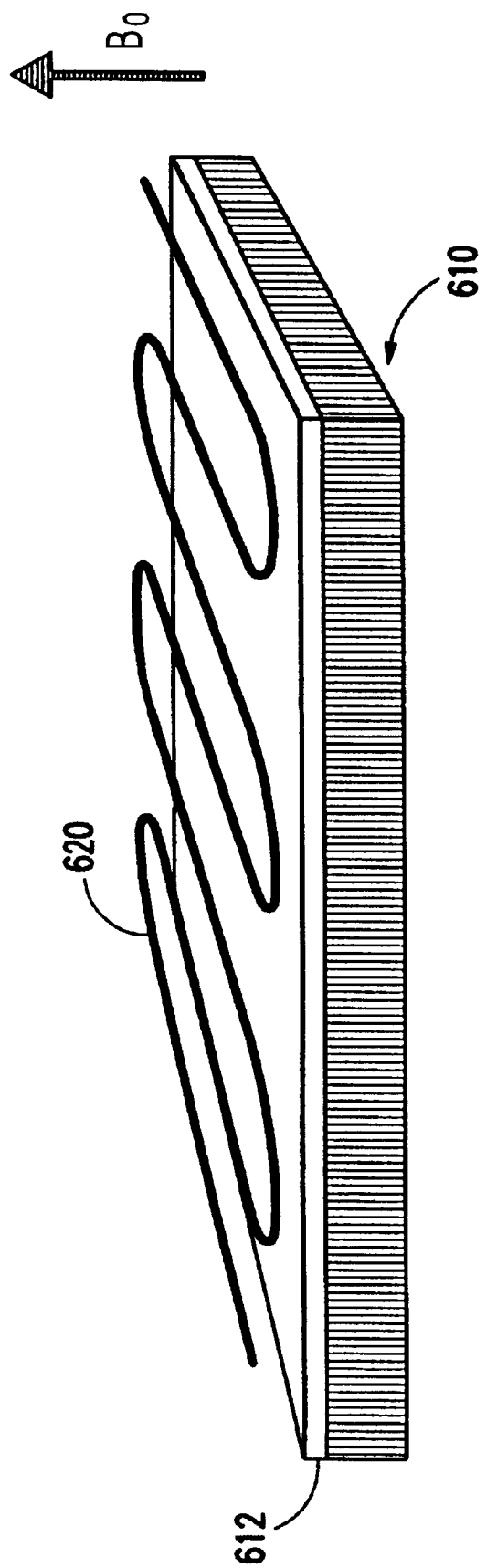
FIG. 6A is a schematic diagram showing a meander coil located near a target surface.

If one dimension of a sample is much smaller than another dimension such as "flat" samples, the average field gradient would be less than optimal using the distribution of magnetic material in a force-detected NMR spectrometer optimized for spherical samples of the invention. This is analogous to the case of traditional, inductive NMR spectrometer design, where a sensitivity advantage can be gained by redesigning the receiver coil for samples not conforming to, for example, the filled 5 mm cylindrical NMR tube. Thus, a flat "meander coil" 620 as shown in FIG. 6A could be used to both selectively excite resonance in a surface 612 of chemical interest in the presence of bulk material 610 and to maximize sensitivity in detecting the resonance. The detection sensitivity of the meander coil 620 is greater than that of a hypothetical "standard" NMR coil because the meander coil is closer on average to the excited spins on the surface layer 612.

Figure 6B:
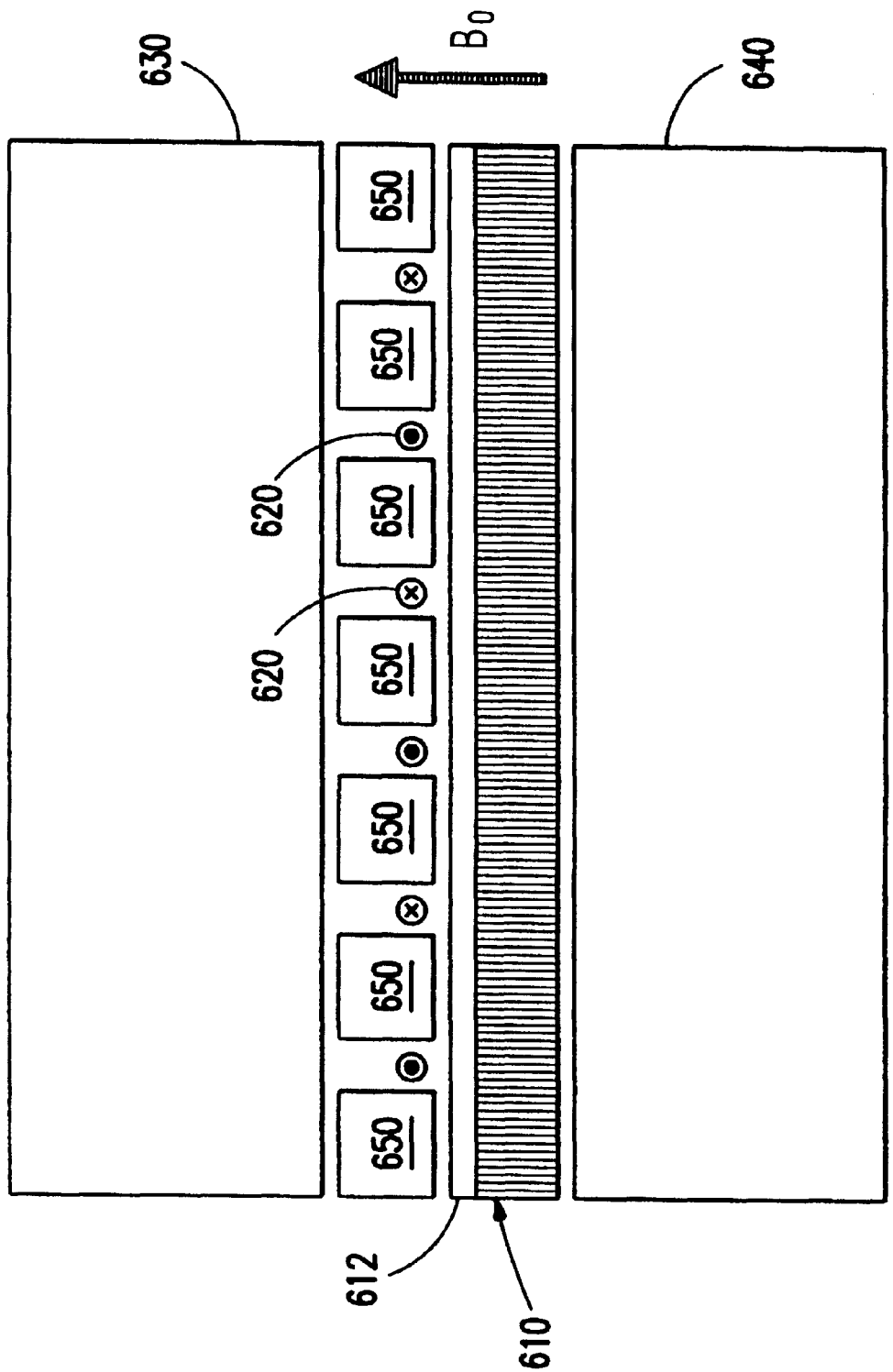
FIG. 6B is a schematic diagram showing one embodiment of the force-detected NMR system for measuring "flat" samples in accordance with the invention.

In the context of the present invention, the magnetization profile in a surface sample excited by the meander coil 620 would be sensitively detected by the arrangement of oscillating sensor magnets shown in FIG. 6B. A pair of magnets 630 and 640 are positioned and configured to produce the spatially homogeneous magnetic field $B_0$. An array of sensing magnets 650 are placed between the meander coil 620 near the target surface 612 for NMR detection. Each sensing magnet is affixed to a mechanical oscillator. Thus, the sensing array is used so that the surface 612 may be measured. This force-detected NMR system may be used for characterizing or imaging a flat sample, such as a semiconductor wafer surface.

Figure 7:
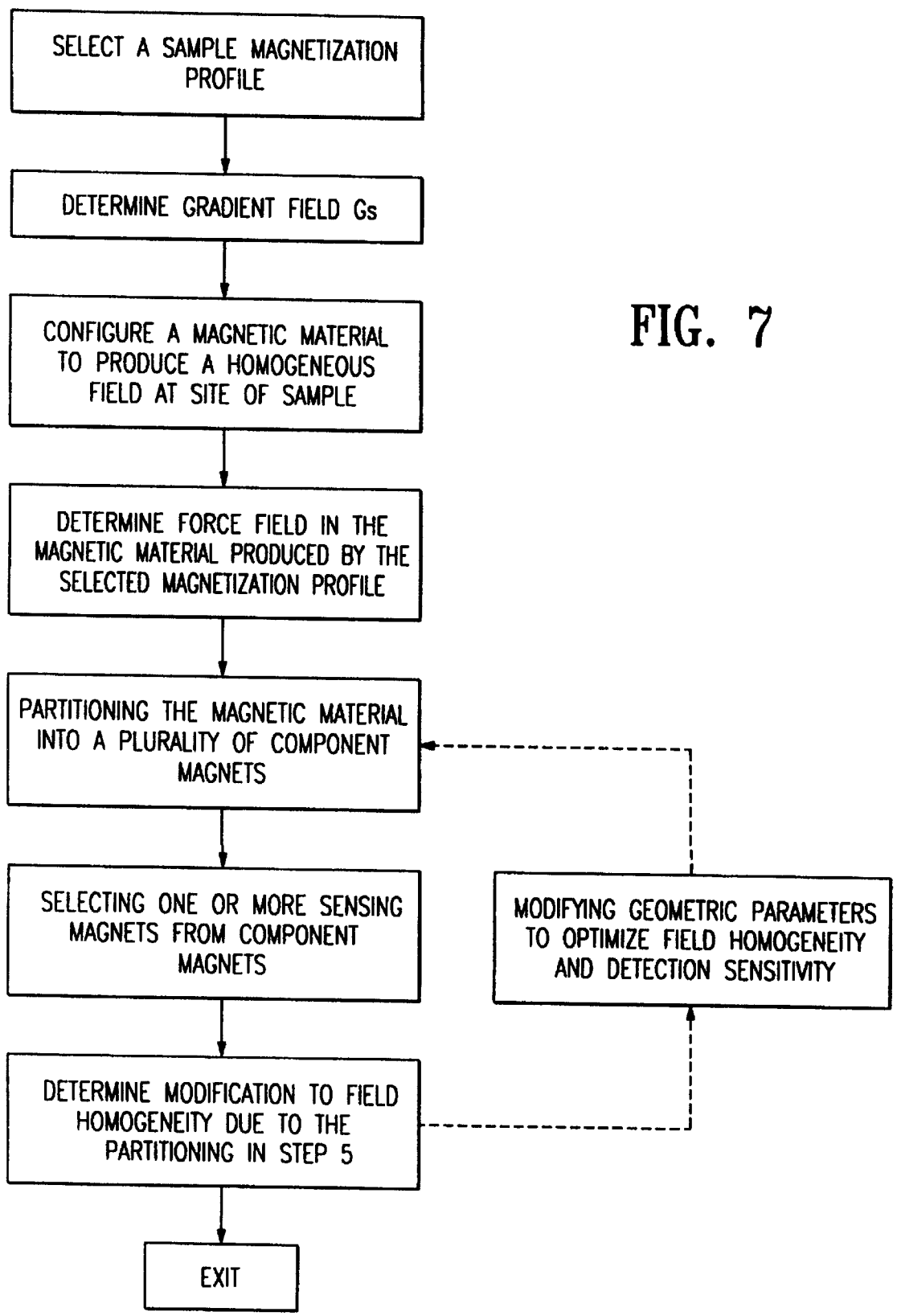
FIG. 7 is a flowchart illustrating a procedure for designing a composite magnet assembly.

According to the invention, a composite magnet assembly for force-detected NMR may be designed and optimized for a sample with an arbitrary geometry using the following design method as shown by a flowchart in FIG. 7.

1. Choose a sample magnetization profile for a given range of sample geometries.

2. Determine the gradient field $G_s$ of the predetermined sample magnetization profile.

3. Configure a magnetic material with respect to a chosen site of a sample so that the magnetic field produced by the magnetic material is spatially homogeneous at the sample. The magnet material can be ferromagnets, electromagnets or a combination of ferromagnets and electromagnets.

4. Calculate force field F in the space occupied by the magnetic material.

5. Divide the magnet material into two or more pieces that experience unequal forces in the gradient field $G_s$. One guide for this division is a set of nodal surfaces through which the force direction along a conveniently selected coordinate changes sign. Some geometric parameters (e.g. dimensions, cone angles, etc.) may affect the division.

6. Select a piece of the magnet material that is divided in the step 5 as a sensing magnet and determine the expected detection sensitivity using the magnetic force field F and known motional mass determined by the configuration of a mechanical oscillator.

7. Calculate modification to homogeneity imposed by removal of magnetic material in the process (step 5) of partitioning magnet for relative motion.

8. Optionally, steps 5–7 may be iterated by modifying the geometric parameters or the overall geometric model until the homogeneity and sensitivity criteria are satisfied.

Sensitivity: Force Detection v. Magnetic Induction

Since the static magnetic field at the sample is spatially homogeneous in an NMR system in accordance with the invention, many NMR detection techniques developed for the induction NMR can be combined with the force-detected NMR, which is difficult with the conventional force-detected NMR systems. Thus, the performance of a force-detected NMR system of the invention (i.e., magnetic force acting on a mechanical oscillator) and a conventional induction NMR system (i.e., emf induced electrical signal in an RLC circuit by Faraday induction) can be compared based on a common detection procedure.

FIG. 8A shows an exemplary pulse sequence that can be used to evaluate the optimum sensitivity of an induction NMR system. See, for example, Weitekamp, in Adv. Magn. Reson., vol. 11, pp. 111 (1983). Two $\pi/2$ pulses separated by a time duration $t_1$ are used in this pulse sequence. In a force-detected NMR of the invention, the spin evolution in a period $t_1$ is separated from driving and/or detection in a period $t_2$ for the purpose of optimizing sensitivity. Therefore, this detection technique can be used to quantitatively compare the force-detected NMR system and the induction NMR system. In both systems, the spin order present initially (typically the equilibrium magnetization due to the magnetic field) is modulated at the NMR frequencies of interest during the evolution period, illustrated here by the simplest time-domain sequence for measuring the autocorrelation function of precessing transverse magnetization. This is shown in FIG. 8B. The resulting magnetization $M(t_1)$ carries the information of interest and the goal of the detection period is to detect this quantity with optimal sensitivity.

For samples in practical NMR applications, the sensitivities of both magnetic induction NMR and force-detected NMR are primarily limited by thermal noise in the detection. For force detection NMR systems, noise is mainly contributed from the Brownian motion of the mechanical oscillator. See, Sidles et al. in Reviews of Modern Physics, Supra. and Sidles et al., in Review of Scientific Instruments, Vol. 63, pp. 3881 (1992). For inductive detection, the noise is limited by the Johnson noise in the RLC circuit. See, Abragam, supra. and Peck et al. in Journal of Magnetic Resonance, Vol. B108, pp. 114 (1995). The relevant noise spectral densities in the two cases are, respectively, $$S_F = \sqrt{4k_B T\alpha} \quad (\text{in } N/\sqrt{\text{Hz}}) \tag{10}$$

$$S_I = \sqrt{4k_B TR}, \quad (\text{in } V/\sqrt{\text{Hz}}) \tag{11}$$

where $\alpha = m\omega_F/Q_F$ is the damping constant of the mechanical oscillator of mass m, $R = L\omega_0/Q_I$ is the effective resistance in the inductive system, T is the absolute temperature, and $k_B$ is the Boltzmann constant. The damping of the oscillator may be due to various mechanisms including viscosity of the surrounding medium about the oscillator. R is typically dominated by the resistance of the receiver coil. The spectral densities are nearly independent of frequency over the small bandwidth of the detector oscillator.

Consider the case in which the oscillator is brought to a steady state in a time duration shorter than the decay time $T_m$ of the magnetization during detection. For magnetic-induction detection at the Larmor frequency $\omega_0$ with a detection coil quality factor $Q_I$, the steady-state condition is $2Q_I/\omega_0 << T_m$ and it is well-satisfied for usual values of the parameters with $T_{1\rho}$ playing the role of $T_m$. For force detection at the oscillator frequency $\omega_F$ with a mechanical quality factor $Q_F$, the corresponding condition, $2Q_F/\omega_F << T_m$, can and should be violated for practical parameters. Here, the time $T_m$ can be as long as the spin-lattice relaxation time $T_1$ when an effective pulse sequence is used for inversion. When this condition is not satisfied, the steady-state amplitude may still be achieved in a time short compared to $T_m$ using force feedback and the steady-state sensitivity estimate still applies.

The expected force signal can be obtained directly by integrating Equation (9), with the differential quantities $d\mu_s = M_s dV_s$ and $d\mu_d = M_d dV_d$, over the volume of the sample and the sensor magnet. For a uniformly magnetized sample, the result can be put in the form $$F = \frac{\kappa_F \mu_0 V_s M_s M_d}{R_{\max}}, \tag{12}$$

where $V_s$ is the sample's volume, $M_s$ is its magnetization, $M_d$ is the magnetization of the sensor magnet, $R_{max}$ is the distance of the sensor magnet from the center of the sample, and $\kappa_F$ is a dimensionless constant that characterizes the geometry of the particular design of the force-detected NMR system and is found as a result of the integration of Equation (9). For comparison, the signal in inductively detected NMR (an EMF induced in a conductor) may also be computed by integrating over the electromagnetic response of the coil to the field of the modulated magnetization. At the position r of an element of conductor d1, the sample dipole $d\mu_s = M_s dV_s$ produces an electric field:

$$dE = -\frac{\partial}{\partial t}\left(\frac{\mu_0}{4\pi} d\mu_s \times \frac{\hat{r}}{r^2}\right). \tag{13}$$

The EMF induced in the conductor element is $$d^2\varepsilon = dE \cdot dl = -\frac{\partial}{\partial t}\left(\frac{\mu_0}{4\pi} d\mu_s \times \frac{\hat{r}}{r^2} \cdot dl\right), \tag{14}$$

an expression that is readily integrated for conductors and samples of any shape. For a uniformly magnetized sample, the result can be put in the form $$\varepsilon = \frac{\kappa_I \mu_0 V_s M_s \omega_0}{R_{\max}}, \tag{15}$$

where $\omega_0$ is the Larmor frequency (which arises in the time derivative), $R_{max}$ is now the closest approach distance of the coil conductor to the center of the sample, and $\kappa_I$ accounts for the specific coil geometry, in analogy to $\kappa_F$. For example, for the 136 $\mu$m long 6-turn solenoid constructed with 15 $\mu$m diameter copper wire with inner diameter $2R_{max} = 68$ $\mu$m used in the numerical example below, $\kappa_F = 2.56$.

Equations (12) and (15) are the maximum values of sinusoidal signals. Combining the rms values (smaller by $2^{1/2}$) with the noise spectral densities given by Equations (10) and (11) gives the signal-to-noise ratios in the following convenient forms $$SNR_F = \frac{\kappa_F \mu_0 V_s M_s M_d / R_{\max}}{\sqrt{8k_B T\alpha \Delta \nu}}, \tag{16}$$

$$SNR_I = \frac{\kappa_I \mu_0 V_s M_s \omega_0 / R_{\max}}{\sqrt{8k_B T R \Delta \nu}}, \tag{17}$$

where $\Delta\nu$ is the bandwidth of the measurement. The format of the above equations can be readily used for comparing two different NMR schemes. Note that Equation (17) avoids the use of coil volume and filling factors (Abragam, supra.), which are well-defined for long solenoids but not for other shapes. The resonance quality factor $Q_I$ is also not explicitly expressed in Equation (17) since quality factor is not a relevant concept in the limit of micron-scale coils where the calculated $Q_I$ would be comparable to or less than unity and therefore not readily measurable in the usual way. The resistance R needs to be evaluated at the detection frequency and is higher than the DC resistance. The scaling of resistance ratios, $R_{RF}/R_{DC}$, is well understood on the basis of standard skin depth theory and is tested for wires down to below $10^{-4}$ m. See, Peck et al., supra. The inductive examples below assumes the scaling of resistance ratios, $R_{RF}/R_{DC}$, is valid for wires down to $10^{-5}$ m.

A special NMR detection situation is considered here in which an optimized detection period is used to measure the nuclear magnetism which survives some prior evolution period. Any rf pulse sequence that can be used in the magnetic induction NMR during the spin evolution period may be used in the force-detected NMR of the invention since the options on sample environment (e.g., homogeneity of the static field) and mounting are similar. In particular, flowing or spinning samples are possible, in contrast to methods where the sample is part of the high-Q micro-oscillator. Without considering particular target spectra, the SNR expressions of (16) and (17) can be converted to per-root-repetition SNR expressions for the first point $S(t_1 = 0)$ of a pointwise experiment. The optimum bandwidth in such a situation is determined by the decay of the signal during the detection period as $$\Delta\nu = 1/(T_m \pi) \tag{18}$$

In ordinary inductive NMR, a sensitive method is to perform a pulsed spin-locking sequence during $t_2$ (Weitekamp, supra.). During a train of resonant rf pulses in spin-locking, the transverse magnetization drives an RLC circuit tuned to the Larmor frequency while decaying with a time constant $T_{1\rho}$ (typically about 10–1000 ms). This decay time is comparable to or longer than the decay time $T_2$ of the free induction decay. For a system with an unresolved magnetic-dipole spectrum, this leads to a gain in sensitivity, relative to detection of the free induction decay, of up to $(bT_{1_p}/T_2)^{1/2}$ where factor b is the effective duty cycle of the receiver. Factor "b" may be considerably less than unity because of the receiver overload during and after each rf pulse. One should, for inductive detection, set $T_m=b\, T_{1r}$ in Equation (18) to correct for this lost detection time, but b=1 is used in the numerical examples of sensitivity analysis.

In the NMR detection method of this embodiment, the longitudinal magnetization is the relevant component during $t_2$. Similar to Rugar et al., Science, supra., the longitudinal magnetization is inverted twice per oscillator period in order to drive the oscillator in proportion to its amplitude. Alternatively, one might also set $T_m=T_1$, which could be a significant advantage of the present method for systems where $T_1 \gg T_{1_p}$. In the examples below, $T_m=T_{1r}=1$ s is assumed.

A delay several times longer than the longitudinal relaxation time $T_1$ may typically be needed in order to recover the equilibrium magnetization for the next shot. Alternatively, some other (nonequilibrium) method of refreshing polarization can be used. This feature is common to all time-domain methods and not generally relevant to a comparison of per-root-shot sensitivities of competing methods. Note, however, that there is a synergy in the fact that nonequilibrium methods of polarization are generally more practical on smaller samples, which will be shown to be the realm where the sensitivity advantage of the present invention is greatest. Again, the absence of any special mounting of the sample in the present method provides flexibility in implementation of alternative polarization methods, in contrast to methods that require that the sample be bound as part of the oscillator.

One important feature of the SNR expressions of Equations (16) and (17) is the difference in their dependence on the Larmor frequency $\omega_0$. For coil conductors with radii larger than the rf skin depth $\delta$, the resistance is inversely proportional to $\delta$, so that $R\,\omega_0^{1/2}$, and therefore $SNR_I\,\omega_0^{7/4}$, including the factors of $\omega_0$ in Equation (17) from Faraday's law and in $M_s$ from Curie's law for the equilibrium nuclear magnetization. For conductors with radii smaller than the skin depth, R is frequency-independent, so that $SNR_I\,\omega_0^2$ at this size-scale.

The force detection NMR, which only shares the factor of $\omega_0$ from Curie's law, is therefore less sensitive to a decrease in Larmor frequency in both size-scale regimes. Hence, a greater relative sensitivity advantage can be realized using force detection NMR when observing nuclei with smaller gyromagnetic ratios or working at lower magnetic field strength. In addition, force detection NMR, including the present invention, is equally applicable in the highest available fields and has the potential for achieving higher sensitivity at sufficiently small sample size.

The SNR expressions may be illustrated with parameters in the following hypothetical mineralogical study. For a 60 $\mu$m diameter spherical particle, the oscillating magnet, optimized as discussed with $R_{max}=34\,\mu$m (4 $\mu$m clearance), is 40 $\mu$m in diameter and 18 $\mu$m thick. The "shape factor" $\kappa_F$ of Equation (16) is about 0.0723 for this magnet, which is assumed magnetized to the saturation magnetization of iron, 2 T/$\mu_0$. The NMR field is also 2 T. With a motional mass of 0.18 $\mu$g and a resonance frequency of 500 Hz, a mechanical $Q_F$ of 3000 corresponds to a dissipation factor of $\alpha=1.9\times10^{-10}$ Ns/m. For $^1$H NMR of a room-temperature solid sample 0.1% in H$_2$O, the per-root-shot values are $SNR_F=5.8$ for the proposed force method, compared to $SNR_I=0.17$ for inductive detection (R=0.21 $\Omega$, corresponding to $Q_I=1.1$). For other nuclei that have lower Larmor frequencies, the relative advantage of the force detection method is even greater. This is illustrated by considering the challenging case of $^{29}$Si NMR (4% natural abundance) of a typical mineral ($^{29}$Si spin density=5.4$\times 10^{26}$/m$^3$) for which the present method gives $SNR_F=0.70$, more than two orders of magnitude more sensitive than the magnetic induction experiment ($SNR_I=0.0057$). This example illustrates the advantage relative to magnetic induction and the adequacy of the method for the great majority of isotopes at natural abundance and at typical stoichiometries and temperatures.

Another important feature of Equations (16) and (17) is the difference in their dependence on the length scale for an experiment at fixed Larmor frequency. The sample volume $V_s$ is explicitly included in both expressions since the magnetic moment is dependent on the sample size. The mass of the oscillating magnet scales the same as the sample volume, since in an optimized design, the dimensions of the sample and moving magnet are in a fixed ratio.

The size scaling of the dissipation factors $\alpha$, and R for the force detection and the induction detection is different according to Equations (16) and (17). A difference in scaling behavior between the two detection methods is caused by the scaling of the dissipation factors R and $\alpha$, which is given by $$\alpha = m\omega_F/Q_F = k/(\omega_F Q_F), \tag{19}$$

where k is the mechanical compliance of the mechanical oscillator and m is the motional mass of the assembly of the sensing magnet and the mechanical oscillator.

For the force-detected NMR, the scale-dependence of the oscillator frequency is not a simple matter, since the negative potential curvature that can be achieved with magnetic and Coulombic forces allows considerable design freedom. Two different situations may be considered. In a first situation, the oscillator frequency is scale invariant. In a second situation, the oscillator frequency scales as $r^{-1}$, which is the result for mechanical restoring forces from materials with scale-invariant elastic moduli (Sarid, Scanning Force Microscopy, New York, Oxford University Press, p. 17, 1991).

Scaling relations with size and frequency for mechanical dissipation in microscopic resonators appear not to be quantitatively understood at present. If we suppose that equally high-Q resonators are available for samples in the size range of interest, $SNR_F$ scales as $r^{1/2}$ for a fixed $\omega_F$ or r if $\omega_F$ scales as $r^{-1}$.

Equation (19) reveals different ways of reducing the dissipation factor $\alpha$ of a desirable oscillator in order to maximize the detection sensitivity. For example, for a fixed m and $Q_F$, the SNR may be reduced by operating at a low resonance frequency $\omega_F$; for a given spring constant $\kappa$, $\omega_F Q_F$ may be increased to reduce the noise. Hammel et. al. have constructed high-frequency (100 MHZ) oscillators and have indicated large $\omega_F Q_F$ as desirable for a given spring constant k (Journal of Low Temperature Physics, Vol. 101, p. 59, 1995).

Equations (10) and (16) indicate that it is desirable to reduce the natural damping constant $\alpha$. The damping factor and the force fluctuations are related by a fluctuation-dissipation theorem. Feedback detection schemes do not change the thermal force spectral density given by Equation (10). If $Q_F$ and k are independent with respect to each other, then softer resonators are needed and magnetic or electrical means of controlling the spring constant of the system may be used to increase the SNR. If, on the other hand, k and $\alpha$ are independent with respect to each other, then $Q_F$ and k are proportional to each other with a constant ratio and "soft" oscillators usually do not necessarily improve the SNR since $Q_F$ is degraded as k is reduced. A mechanical oscillator can be used as an analogous equivalent to a hypothetical RLC circuit having a lossless inductor and capacitor with α and k corresponding to R and 1/C, respectively. If very tiny resonators can be made more sensitive by simply making them mechanically softer (for a given constant $Q_F$), then the negative curvature from magnetic and/or electric forces, as in the configuration shown in FIG. 5, can provide a significant advantage even for the goal of single-spin imaging, where a large static field gradient has additional use in intentionally restricting the coupling to a single spin or a layer of atomic thickness. Such schemes may also have a practical advantage in that one may use thicker, more mechanically robust, and more easily fabricated suspensions, with low cost in sensitivity provided the resonator mass is dominated by the sensing magnet rather than the mechanical suspension.

For the magnetic induction NMR, the rf resistance is scale-invariant for coil conductors much larger in diameter than the rf skin depth δ. Thus, the signal-to-noise ratio $SNR_I r^2$ in the millimeter size range commonly used in induction NMR measurements. If the diameter of the coil conductors is below the skin-depth limit, the rf resistance R becomes proportional to $r^{-1}$ and $SNR_I r^{5/2}$. These scaling relations have been confirmed with small NMR coils. See, for example, Peck et al., supra.

Therefore, the ratio, $SNR_F/SNR_I$, in both size-scale regimes depends inversely on size, so that the system and method of force-detection NMR of the present invention may be preferable to magnetic induction if the size of the sample is below a critical sample size which is at least in part dependent on the spin species and Larmor frequency.

In the aforementioned numerical examples using only permanent magnets, the critical sample size is approximately on the order of 200 μm. This is relevant when instrument cost or portability are paramount considerations. It is also of interest to consider examples in which higher fields, possible with superconducting magnets, are used. This is advantageous whenever larger equilibrium magnetization and/or better resolution of Zeeman interactions are needed. Because of the linearity with Larmor frequency of the Faraday law electromotive force, magnetic induction has a relative advantage when the static field is relatively high. However, if the rf resistance continues to scale as $r^{-1}$, the force-detection NMR scheme can be more sensitive at a sufficiently small scale than the induction NMR scheme. For example, consider the signal from one proton in a hypothetical 50,000 amu molecules with a density of 1.6 g/cm³ and filling the sample volume. If ideal magnetization transfer is assumed, then the spectrum of interest might be that of a heteronuclear label, but this will not figure in the sensitivity calculation. With a field of about 14.07 T and other parameters the same as in the previous low field examples, the signal-to-noise ratios per-root-shot for force detection and inductive detection are, respectively, $SNR_F$=4.4 and $SNR_I$=0.56. An even greater advantage may be achieved if the detection takes place directly on the heteronucleus.

Exemplary Applications

The present invention can be used in various NMR measurements with advantages. The following are some examples of such applications. One skilled in the art may apply the present invention to other applications based on the description of the invention.

1. Force-Detected NMR Spectrometers

The spatially homogeneous polarizing field at the sample allows a NMR system in accordance with the invention to use many well-developed NMR detection methods and techniques. See, for example, C. P. Slichter, Principles of Magnetic Resonance, New York Springer-Verlag, 1990; Richard R. Ernst, Principles of Nuclear Magnetic Resonance in One and Two dimensions, Oxford Clarendon Press, 1987; and A. Abragam, Principles of Nuclear Magnetism, Oxford, Clarendon Press, 1961. Therefore, a force-detected NMR system of the invention can have versatile applications by utilizing these NMR techniques with improved sensitivity, especially for measuring small samples.

The force-detected NMR spectrometer based on the invention is capable of simultaneously achieving high detection resolution and sensitivity, specially for small-scale samples. This is accomplished at least in part by combining the homogeneous field at the sample and the force detection technique.

An important goal of spectroscopy in general and nuclear magnetic resonance in particular is the determination of the structure and dynamics of molecules in ways that require the least sample and are applicable in the greatest variety of chemical situations. It is recognized as a feasible goal that force-detected NMR imaging should, with technical improvements, be feasible down to the level of individual atoms. Sidles et al. Reviews of Modern Physics, supra. In the limit of single molecules and oscillators scaled down and cooled as appropriate to study them, the sensitivity of the present method is at least as good as these force-detected NMR imaging methods, but its potential for the study of structure and dynamics is much greater, since it allows spectroscopy of all phases of matter and imaging in those phases where sufficiently static distributions of matter are present.

A major part of the cost of high-field NMR instrumentation is the cost of the magnet. The cost increases rapidly with the field strength and with the volume over which the field is suitably homogeneous. An NMR spectrometer based on the present invention allows given goals of sensitivity, magnetic field strength and field homogeneity across the sample to be realized with a smaller volume. This is advantageous in allowing less expensive magnets to be used and in allowing the experiment to be done at the highest fields, where the available homogeneous volume is insufficient for other NMR methods.

Reduction in the size of the magnet leads to low mass, low volume and low power requirements for the rf irradiation. Thus, the present method is the preferred method of NMR when portability issues are paramount. This would include the robotic deployment of NMR on earth or in space. It is also a key issue when NMR is to be used for in situ monitoring of process streams. The present invention would allow implantation of NMR spectrometers in living organisms with the information being stored until retrieval or telemetrically relayed or used within the organism for purposes of feedback in an artificial homeostasis procedure. At present the cost of NMR instrumentation is such that it creates bottlenecks in analysis and in educational uses. The present apparatus is expected to be the most economical implementation of NMR over a wide range of performance requirements. This could lead to qualitative changes in the market for NMR. Personal spectrometers would be affordable in the teaching environment. Massively parallel analysis would be practical. This might take the form of the same experiment being performed on (possibly) different samples simultaneously or parts of a needed experiment or suite of experiments being performed on nominally identical samples. In both cases, the advantage in throughput could have economic advantages that would outweigh sensitivity issues per se.

2. Detection of Transverse Magnetization

The present invention can be used for detection of transverse magnetization, rather than longitudinal magnetization, in (for concreteness) roughly spherical samples. In that case the instantaneous magnetization profile is that of a sample uniformly magnetized along a transverse axis that precesses in the transverse plane.

Figure 9:
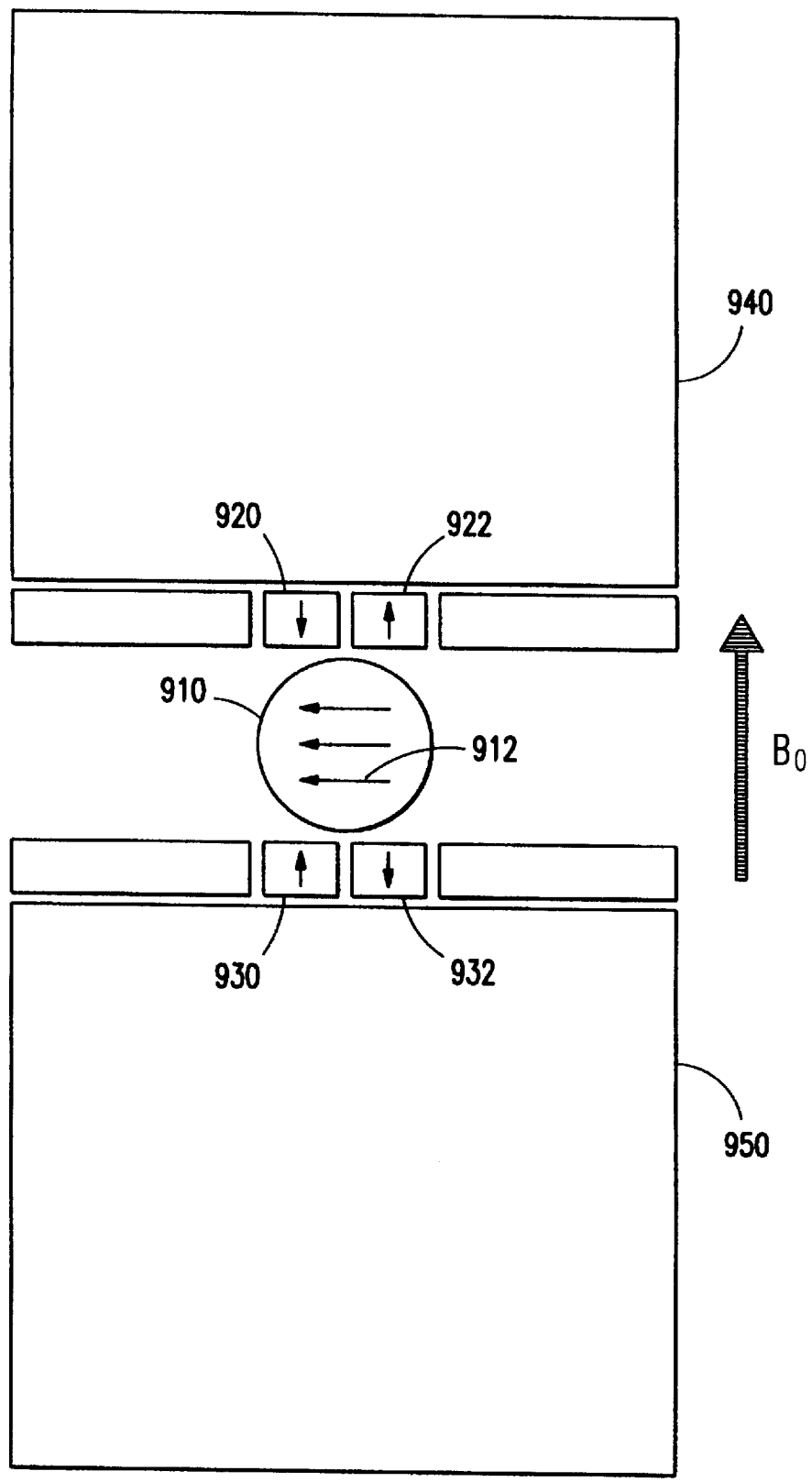
FIG. 9 shows one embodiment of the force-detected NMR system of the invention for measuring a transverse magnetization of a sample.

FIG. 9 shows an embodiment for detecting transverse magnetization. The composite magnet assembly includes a pair of magnets 940 and 950, four sensing magnets 920, 922, 930 and 932 and produces a homogeneous field $B_0$ at a sample 910. Sensing magnets 920 and 922 are located on top of the sample 910 and sensing magnets 930 and 932 are located below the sample. The sample 910 has a magnetization 912 perpendicular to the static polarizing field $B_0$. This may be achieved, for example, by applying a $\pi/2$ rf pulse to the sample. The transverse magnetization 912 precesses about the direction of the field $B_0$. The instantaneous forces on the sensing magnets are shown by arrows in FIG. 9. In high field applications, the rapid (~$10^3$ MHZ) precession of this magnetization 912 about the static field direction and the much smaller rate (<1 MHZ) of additional modulation of the nuclear magnetization which is possible by way of spin interactions or resonant irradiation, would lead to oscillator frequencies $\omega_F$ comparable to the precession frequency.

At oscillator temperatures $T > \hbar\omega_F/k_B$, the aforementioned high oscillator frequency would lead to decreased sensitivity relative to the much lower oscillator frequencies that are possible when the longitudinal magnetization is coupled to the oscillator. However, a more precise statement of the relevant temperature for calculation of the dissipating Brownian-motion noise is $$T_{eff} \approx (\hbar\omega/k_B)[\exp(\hbar\omega/k_B T) - 1]^{-1},$$

which becomes lower than T as T is lowered into the regime where the inequality above is reversed, so that $T < \hbar\omega_F/k_B$. Thus, it may be possible at low oscillator temperatures and/or high frequencies for transverse magnetization to be the preferred observable from the viewpoint of sensitivity.

3. Continuous Wave Detection and Magnetometry

The present invention may be used to monitor the displacement of the oscillator as a function of the varying frequency of irradiation by obtaining the spectrum of frequencies at which the sample absorbs electromagnetic radiation. Modulation of the magnetic field and/or the amplitude, phase, and/or frequency of the radiation so as to drive the oscillator near its mechanical resonance will generally be desirable to increase sensitivity. A variety of such modulation methods have been described in the context of force-detected magnetic resonance in magnetic field gradients. The key difference with the present apparatus is that it allows such spectra to be taken in a homogeneous magnetic field, vastly increasing the information content. A corollary is that the spectra will have far greater sensitivity, since in such a CW experiment the linewidth and the sensitivity are inversely related. The inventors also note that even spectroscopic transitions that are not classified as magnetic resonance may give rise to changes in the magnetization of the sample. For example, an electronic transition is generally associated with a change in the diamagnetic moment of the sample. These changes also may be used to drive the oscillator and thus such transitions may be observed in this way. Because the amplitude of spectral lines detected in this way would be proportional to the difference in magnetic moment of the states so connected, this method would provide information not present in other forms of spectroscopy on the same transitions.

Oscillating changes in the magnetic moment of a sample may be brought about in ways that are unrelated to spectroscopy. The changes in magnetic moment of a sample with pressure, temperature, or other state variables is part of the field of magnetometry. The present apparatus has a sensitivity advantage over prior methods of magnetometry, and appears to be simpler and more economical.

Another method of magnetometry is to modulate the coupling between the sample's (nominally fixed) magnetic moment and the measuring apparatus, for example, by cyclically moving the sample in and out of the region of strongest coupling. The present apparatus is usable and advantageous in this mode of operation as well.

4. Real-Time Detection

Most modern magnetic induction NMR measures the time-domain interferogram (free induction decay) of the transverse nuclear magnetization. This method is usually called Fourier-transform NMR (FTNMR), because the signal as a function of time is the Fourier transform of the magnetic resonance spectrum. Since the detection is coincident with the spin evolution of interest, this can be called a real-time method. Variations of inductively-detected FTNMR include coherent manipulation of the spins or the sample in order that the spin evolution occur under some desired effective Hamiltonian, for example, one in which certain interactions between spins are averaged to zero.

One aspect of the present invention is to perform such real-time detection using force-detected NMR techniques. The longitudinal component of the magnetization usually does not oscillate in high field except when driven by resonant irradiation. In large field gradients, cyclic driving is only practical with adiabatic rapid passage and the appearance of spectroscopic frequencies in the magnetization is absent by the adiabatic nature of this inversion sequence.

The present invention can be used to realize a class of high-field real-time NMR methods which can provide valuable spectroscopic frequencies and other information with high throughput. It is well-known that effective Hamiltonians realized through coherent irradiation near the Larmor frequency may not commute with the longitudinal spin angular momentum of one or more nuclear species. An example is the WHH-4 sequence for homonuclear line narrowing and the many improvements and variations of it which create an effective axis of precession with projections onto both the longitudinal axis and the transverse plane. Although such transients are nearly always detected by way of their transverse components, it is evident from the theory that the longitudinal component carries the same spectral information, but as an audio frequency modulation, since each spectral component is shifted down by the carrier frequency. This fact appears to have been used previously only in less efficient frequency domain approaches and with inductive detection which has very poor sensitivity at audio frequencies. The inventors of the present invention believe that the Fourier transform variant of real-time detection of longitudinal detection has the same advantages relative to CW detection that are already well-known in the context of transverse detection. Multiple-pulse sequences already known to measure any desired set of spin interactions may be used or adapted so that the spin evolution of interest appears in the time dependence of the longitudinal magnetization. The requirements are that the effective Hamiltonian not commute with the longitudinal angular momentum of interest and that there be repeated intervals when the magnetization has a longitudinal component. The oscillator is driven by the forces already described which are associated with the various Fourier components of this oscillating magnetization. In general, this response should include the transient response as well as the steady-state response and may be modified by feedback. In any case, because of the linearity of the harmonic oscillator, the driving forces proportional to the magnetization may be extracted by well-known algorithms.

The present invention is an enabling technology for this method, as it can provide a sensitivity advantage that would be lacking with inductive detection. Note that the sensitivity arguments given to date in comparing inductive and force-detected methods only consider the noise which is associated with the random thermal interactions which drive the oscillator toward equilibrium during the detection period. Such thermal (Johnson or Brownian) noise is additive to the signal and essentially uniform in spectral density across the small frequency range over which the oscillator has a usable response. It is an adequate description of the dominant term in the denominator of the most commonly used notion of signal-to-noise ratio, which is the ratio of the frequency-domain amplitude of the resonance of interest to the r.m.s. noise in the regions between spectral lines. Implicit in this analysis is that the signal itself is sufficiently reproducible so as not to be an important source of uncertainty. Such a noise analysis is frequently adequate to real-time schemes, including the present one. Freedom from additional noise sources, sometimes called $t_1$ noise, which result from uncontrolled or uncontrollable fluctuations, is an additional practical advantage of the real-time method, since these other noise sources may be difficult to control.

The real-time detection scheme may also be used as a detection period of a multidimensional experiment, in direct analogy to the way inductive detection of transverse magnetization is used in modern NMR.

5. Measuring Small Samples

Although many aspects of the present invention are most closely related to force-detected NMR, the present invention may be compared to inductive detection NMR in evaluating its utility and performance since many spectroscopic techniques for induction can be used with the present invention but are not suitable for conventional force-detected NMR systems. Similarities of a force-detected NMR system based on the invention and the induction NMR include sample, sample manipulation, and NMR pulse sequence. The relative merit of the present invention and inductive detection may be determined primarily by the size of the sample. This may be fixed by the nature of the application, but even when it is not, there will often be reasons of economy or convenience which make a smaller sample desirable, thus making the present method preferable.

A field of application in which the available sample is often small and fixed in size is the field of forensics, where the evidence found comprises the sample and by its nature is unique and largely inviolable. The nondestructive nature of NMR is particularly desirable in such situations as the evidence is fully preserved in case of legal challenge to the findings. The present invention vastly decreases the size of samples to which known or future NMR methods may be applied, thus enabling NMR applications to forensics that would otherwise be impractical.

Similar considerations apply to many scientific studies of objects that are intrinsically small. Biological and medical research is an area where NMR spectroscopy and imaging are widely used because of the information available non-destructively on the structure of tissues and the composition, rates of reaction and mobility of their chemical constituents. These well-known methods are vastly extended in utility when they can performed on single cells or with spatial resolution comparable to or better than the typical size of cells. The present methods clearly make such studies possible. Geological fines and atmospheric particulates are other examples of complex agglomerations of matter where spectroscopic information at small length scales is crucial to improved understanding.

In the preceding examples the samples could be viewed largely as found objects. The methods will also enable new approaches to the design of novel materials. An example is the search for new catalysts, including both new compositions of matter and biologically synthesized molecules which may or may not exist in nature. The present method could greatly facilitate the screening of large numbers of catalysts by making possible the NMR detection of the products (or disappearance of the reactants) with a minimal amount of catalyst present, possibly even a single catalyst molecule. Methods of synthesis are in use in which the production of more than one molecule of a given composition is unlikely, making single-catalyst detection crucial. More generally, the ability to screen small samples has great economic advantage because the search for new materials typically involves a large amount of trial and error, so that the ability to limit the material consumed allows the economic investigation of more possibilities. This rationale is important because of the increasing use of combinatorial synthesis in the search for new useful materials.

Another common problem to which the present invention provides a solution is the determination of the crystal structure or other aspects of the atomic bonding, composition, or dynamics of crystalline material. Frequently single crystals large enough for current methods of NMR spectroscopy or other structural methods are unavailable. Such small crystals, typically tens of microns, are commonplace with proteins, zeolites and related porous materials, and crystals that can only be grown under the high pressure possible in diamond anvil cells. The greatest analytical power of solid-state NMR is available when the orientation of the magnetic field with respect to the crystal axes can be varied systematically. The present invention enables such studies on small crystals, including the special case of a single molecule, where NMR methods developed for single crystals would become applicable because of the sensitivity possible with the present method.

Another area of chemical methodology where small samples are routinely encountered is that of chemical separations. Methods such as chromatography, electrophoresis, and mass spectroscopy are typically limited in throughput such that the output is separated into samples too small for NMR analysis. Such separation methods provide little information on the identity of the separated species, particularly when the species is previously unknown and thus does not match standards. Since NMR is the preferred method of identification and quantification of (novel) chemicals, the value of such separations would be greatly increased by the present method.

6. Magnetic Resonance Imaging

Magnetic resonance imaging (MRI) is achieved by using gradients of the static or rf magnetic fields to create different frequencies of spin evolution at different positions within the sample. A great variety of methods are known. The gradients of the static field may be produced by ferromagnets or electromagnets and are varied in strength or in position or orientation with respect to the sample to achieve imaging. All of these may be adapted to the present apparatus and procedures in ways that are obvious, since they all rely on measurements of the nuclear magnetization. An important factor in the sensitivity of any MRI method is the fraction of the sample from which signal is recorded on a given shot (repetition of the pulse sequence). In previous methods of force-detected MRI [See Ruger et. al. U.S. Pat. No. 5,266, 896 (1993)], this fraction was reduced as a necessary, but undesirable, consequence of the large field gradients needed to encode numerous picture elements across the sample with a method that had poor frequency selectivity. This "sensitive surface" approach (in which only a planar or curved sheet of spins contribute a signal on each shot and this signal encodes only a single spatial coordinate) was largely abandoned in the context of detection by magnet induction in favor of "back-projection" methods in which the entire sample can contribute to each shot or "zeugmatographic" approaches in which switched gradients are used to encode multiple dimensions of imaging within each shot. These modern methods also have the advantage that picture elements are distinguished by their evolution frequencies in the gradient or gradients, rather than by the amplitude of their response to a certain pulse sequence in the presence of the gradient, which allows more picture elements for a given gradient strength. The present invention opens the way to achieving the full sensitivity advantage of force detection, while at the same time allowing for these well-known advantages of modern imaging procedures. With these modern imaging procedures, the spatial resolution is generally limited by the sensitivity, which must be adequate to distinguish one picture element from another with the available contrast. Given a desired volume to be imaged, this pixel sensitivity is thus proportional to the volume of the pixel. The sensitivity advantage of the present method below a certain imaged volume, guarantees that it will make practical smaller pixels and thus better spatial resolution with these preferred imaging paradigms.

7. Instrumental and Methodological Improvements

There are a number of aspects of nuclear magnetic resonance that have greater utility because the present invention allows a reduction in the scale of the sample and apparatus. The present invention leads to performance, applicability, and/or economic advantages in these cases.

Some of the most valuable methods of solid-state NMR require rapid rotation of the sample about one or more axes in order to improve the spectral resolution. It has been found with some such methods that the resolution improves with spinning speed up to and presumably beyond the fastest practical speeds. The fastest practical speed increases for smaller samples. This is because the speed is limited by an upper bound to the velocity of the surface, which at a given rotation rate (angular velocity) scales linearly with the diameter of the rotor holding the sample. At a given rotation rate frictional heating, the velocity of the driving gas stream, and the necessary materials strength of the rotor are all reduced by reducing the radius, thus allowing higher rotation rates and better spectral resolution. Many samples are destroyed by the radial forces or the heating associated with rotation and these failure modes are also moved to higher rotation speed in small samples, allowing a given rotor speed to be used on a greater variety of samples. Another advantage is that in many experiments the usable increment in time between sampling points in pointwise or real-time experiments is a multiple of the rotor period. Thus, faster spinning allows more closely spaced sampling points and greater spectral width without folding in of spectral components.

Another cause of sample heating which limits the applicability of many NMR methods is the dielectric heating of the sample by the rf electric field associated with the rf magnetic flux needed to manipulate the spins. The typical situation is that a certain Rabi frequency is needed to achieve a certain level of spectroscopic resolution or bandwidth. This sets the required transverse rf magnetic field strength, which is typically designed to be approximately uniform over the sample volume. From Maxwell's equations, the inevitable consequence is that the rf electric field grows linearly with radial displacement from the center of the rf magnetic field. The local dielectric heating thus grows as the square of this radial position. This leads to temperatures that may destroy the sample and temperature gradients that may be spectroscopically unacceptable. This heating is minimized by minimizing the sample extent. The temperatures of such smaller samples are also more readily controlled by carrying away the heat at their surfaces. Thus, the ability of the present method to achieve acceptable sensitivity with smaller samples makes possible experiments at higher Rabi frequencies than would otherwise be the case.

A class of magnetic resonance methods requires that the sample be in different magnetic fields during different parts of the experimental procedure. The transition between fields is effected either by transporting the sample between high and low field regions or by switching electromagnets on and off or by some combination of these methods. The small scale possible for the present method of detection facilitates these field cycling procedures. It reduces the distance that must be traveled between regions and the time it takes the sample to cover this distance. This is important, because a principal limitation on such methods is the loss of spin order in transit. If the field cycling is done by creating and destroying the field, then the power required to do this at a certain needed speed is typically proportional to the sixth power of the linear dimension of the experimental apparatus, since the dominant energy cost is the dissipation of the field energy. Thus a smaller apparatus is more economical and with a given available power can switch a greater difference in field strengths or switch more rapidly. More rapid switching allows the field cycling procedure to be applied to more rapidly relaxing spin systems, greatly extending the applicability of field cycling methods.

In some experiments, it is desirable for the spin evolution of interest to occur in the lowest possible field, values below 1 mT often being satisfactory. Particularly in solid-state samples where the molecules or crystallites have all possible orientations (powder samples), such zero-field methods enhance the spectral resolution for observation of magnetic dipole couplings and electric quadrupole couplings. The line positions due to these interactions are independent of orientation if there is no appreciable applied field, while in a field the distribution of orientations would lead to an inhomogeneous distribution of frequencies which obscures the measurement. Such studies are often performed in a field cycling procedure with the high field period used to polarize the spins and sometimes to detect the spins, while the spin evolution of interest occurs in zero field. In other cases the entire experiment is done in zero field, with the spin order being provided by the zero field interactions, such as in pure nuclear quadrupole resonance. The present apparatus is applicable to either of these approaches. The necessary modification is to make the homogeneous field at the sample appreciably zero at the appropriate time. This may be done by removing the sample to zero field or by switching on a compensating field created, for example, by a current in a z-axis solenoid around the sample. The latter possibility allows detection with the present apparatus in zero field. It is well-known that oscillations of the longitudinal magnetization can be achieved by rapidly switching the field to the zero field condition or by resonant irradiation of the zero field transitions. Either method would drive the oscillator as described. Another possible arrangement is to have opposing identical magnetic pole faces with one or both containing the oscillator. Then gradient coils could be used to cancel out the field over the sample volume.

8. Quantum Computing with Magnetic Resonance

It is widely recognized that magnetic resonance has great promise for the hardware realization of novel computing algorithms, generally known as quantum computing. Specifically, it is high-resolution pulsed NMR that is believed to have the potential to materialize such a promise, because of its capability to perform complex manipulations on many-level quantum systems in a time short compared to dissipative relaxation or uncontrolled dephasing. A widely understood figure of merit for such a spectroscopic system and apparatus to be used as a quantum computer is the number of resolvable spectral lines. Other important considerations are the signal-to-noise ratio and the requirements of the method for power, space, and materials.

The force-detected NMR system based on the present invention can provide high-resolution pulsed NMR at small length scales with significantly improved sensitivity. It allows all of the same manipulations of the spin system that are presently used with inductive detection in computing algorithms. Such algorithms designed for inductive detection are readily adapted to the present device with detection of longitudinal or transverse magnetization. Since power, materials, and space requirements are reduced at small length scales (typically as the third power of the length scale) there are great economic advantages to quantum computing with the present invention. The ready adaptation of the present invention to massive parallelism is also highly relevant to computing applications.

Although the present invention has been described in detail with reference to the preferred embodiment, various modifications and enhancements may be predictable by the above description of the invention and by the following claims.

What is claimed is:

1. A magnetic resonance force detection device, comprising:
   a sample site, configured to hold a sample with non-zero spins;
   a static magnetic assembly disposed and configured as a sole source of static magnetic fields for said sample site to generate a net static magnetic field that is spatially substantially homogeneous at said sample site, said static magnetic assembly having at least one sensing magnet positioned relative to said sample site to detect magnetic spin information of said sample;
   an excitation source disposed and configured to produce a time-varying magnetic field at said sample site which modulates said spins of the sample; and
   a mechanical element to which said sensing magnet is coupled, said mechanical element operable to change at least a position or orientation of said oscillator in response to a magnetic force exerted on said sensing magnet.

2. A device as in claim 1, wherein said static magnetic assembly includes a plurality of component magnets arranged relative to one another in a predetermined geometry with respect to said sample site.

3. An apparatus as in claim 1, wherein said magnetic spins are nuclear spins.

4. An apparatus as in claim 1, wherein said sample includes a paramagnetic material.

5. A device as in claim 1, wherein said excitation source is configured so that said time-varying magnetic field has a magnetic component substantially perpendicular to said net static magnetic field.

6. A device as in claim 1, wherein said mechanical element has a mechanical resonance frequency and said static magnetic assembly is operable to modulate said magnetic spins in said sample so that a gradient field produced by said magnetic spins at said sensing magnet has a Fourier frequency component at said mechanical resonance frequency.

7. A device as in claim 1, further comprising an electrically-controlled positioning actuator located relative to said mechanical element, said positioning actuator operating to control said mechanical element at a predetermined position according to a feedback signal which is indicative of said magnetic spin information of said sample.

8. A device as in claim 1, further comprising a positioning sensor disposed relative to said mechanical element and configured to detect a positioning change of said mechanical element so that said magnetic spin information of said sample is extracted according to said positioning change.

9. A device as in claim 1, wherein said net static magnetic field has a spatial variation across said sample that causes a spectral line broadening smaller than a respective Rabi frequency.

10. A magnetic resonance force detection device, comprising:
    means for holding a sample having non-zero magnetic spins;
    means for producing a static magnetic field at said sample;
    means for producing a time-varying excitation magnetic field at said sample, said excitation magnetic field having a direction substantially perpendicular to said static homogeneous field and operating to modulate said magnetic spins of said sample;
    a sensing magnet disposed relative to said sample, operating to receive a magnetic force caused by a gradient field produced by said magnetic spins, wherein said sensing magnet and said means for producing said static magnetic field are configured to produce a total magnetic field at said sample that is substantially homogenous in space;
    a mechanical support to which said sensing magnet is affixed, operating to respond to said magnetic force on said sensing magnet; and
    means for detecting a response of said mechanical support to obtain data indicative of said magnetic spins of said sample.

11. A method of characterizing a sample with magnetic spins using magnetic force detection, comprising:
    applying a total static magnetic field at said sample by using a magnet module and a sensing magnet, wherein said total static magnetic field is spatially homogeneous at said sample;
    producing a time-varying excitation magnetic field at said sample to modulate said magnetic spins in a predetermined manner;
    measuring a magnetic force exerted on said sensing magnet in a gradient field of said sample by detecting a response of a movable mechanical element to which said sensing magnet is affixed; and
    extracting information about said magnetic spins from said response of said mechanical element.

12. A device as in claim 1, wherein said mechanical element includes a part capable of oscillating.

13. A device as in claim 12, wherein said mechanical element includes a cantilever.

14. A device as in claim 12, wherein said mechanical element includes a thin semiconductor plate.

15. A device as in claim 1, wherein said mechanical element has a mass smaller than a mass of said sensing magnet.

16. A device as in claim 2, wherein said component magnets are arranged symmetrically with respect to said sample site.

17. A device as in claim 1, wherein said static magnetic assembly includes a permanent magnet of a ferromagnetic material.

18. A device as in claim 1, wherein said static magnetic assembly includes an electromagnet.

19. A device as in claim 8, wherein said positioning sensor includes one of an optic fiber interferometric sensor, an electron tunneling sensor, a piezosistive sensor, a piezorosistive sensor, or a capacitive sensor.

20. A device as in claim 1, wherein said static magnetic assembly includes a magnet having a magnet surface at or near a surface across which a magnetic force component on a magnetic dipole changes a direction.

21. A device as in claim 1, wherein said static magnetic assembly includes another magnet that is substantially identical to said sensing magnet and is positioned symmetrically with said sensing magnet about said sample site.

22. A device as in claim 1, wherein said excitation source includes an rf coil.

23. A device as in claim 10, further comprising a means for producing an action against a response of said mechanical support, said means producing a signal indicative of said magnetic spins of said sample.

24. A device as in claim 10, wherein said mechanical support includes a movable part and further comprising a positioning sensor to detect a positioning change of said movable part.

25. A device as in claim 24, wherein said mechanical support includes a cantilever or semiconductor membrane.

26. A device as in claim 24, wherein said means for detecting a response of said mechanical support includes a sensor that detects a position change of said movable part.

27. A device as in claim 10, wherein said total field has a spatial variation across said sample that causes a spectral line broadening in said sample smaller than a respective Rabi frequency.

28. A device as in claim 10, wherein said sensing magnet has a magnet surface that is positioned at or near a surface across which a magnetic-field gradient changes a direction.

29. A method as in claim 11, further comprising:
said magnet assembly and said sensing magnet to make a line broadening associated with said total static field less than about a respective Rabi frequency.

30. A method as in claim 11, further comprising: modulating a phase, magnitude, or frequency of said time-varying excitation magnetic field.

31. A method as in claim 11, further comprising: configuring said sensing magnet to have a magnet surface positioned at or near a surface across which a magnetic-field gradient changes a direction.

32. A method as in claim 11, wherein said response of said movable mechanical element is a position change.

33. A method as in claim 11, further comprising applying an external constraint to said movable mechanical element to counter an effect of said magnetic force on said sensing magnet, wherein said response of said movable mechanical element is a signal associated with said external constraint.

34. A method as in claim 33, wherein a mass of said sensing magnet is smaller than a mass of said movable mechanical element.

35. A method as in claim 11, wherein said sample is a single-spin particle.

36. A method as in claim 11, wherein said sample has a spin polarization substantially perpendicular to said total static magnetic field.

37. A method as in claim 11, further comprising: controlling said magnet module to vary an aspect of said total static magnetic field.

38. A method as in claim 37, further comprising substantially reducing said total static magnetic field to zero for a desired period during measuring said sample.

39. A method as in claim 11, wherein said magnet module and said sensing magnet are configured by:

selecting a magnetization profile of said sample;

determining a gradient field of said magnetization profile;

determining a magnetic material that would produce said total static magnetic field at said sample;

computing a magnetic force in the space occupied by said magnetic material;

dividing said magnetic material into a plurality of pieces that experience unequal magnetic forces in said gradient field; and selecting one of said pieces as said sensing magnet and other pieces as said magnetic module.

40. A method as in claim 39, further comprising modifying said pieces to achieve a desired homogeneity of said total static field.

41. A magnetic force detection apparatus for measuring magnetic properties of a sample material, including magnetic susceptibility and magnetic resonance, said material having magnetic spins with non-zero spin angular momentum, and said apparatus comprising:

a sample site, configured to hold the sample material;

means for at least partially aligning the magnetic spins in the material to produce an average net magnetic polarization;

magnetized bodies producing a substantially homogeneous field at and throughout the material and disposed in close proximity to the material to be subject to magnetic forces exerted by the magnetic spins in the material so that said bodies move relative to one another in response to changes in the magnetic forces exerted by the material, means for modulating said forces exerted by the material; and means for detecting the relative motion of the bodies.

42. An apparatus as in claim 41, wherein said modulating means is operable to change the magnetization direction of the spins in the material.

43. An apparatus as in claim 42, wherein said modulating means is operable to irradiate the sample material with radio-frequency (rf) energy in the form of time-varying magnetic fields in one or more pulses or durations.

44. An apparatus as in claim 43, wherein said pulses are substantially at the Larmor frequency of the magnetic spins.

45. An apparatus as in claim 41, further comprising a flexible suspension to which one or more of the bodies are fixed, said flexible suspension having a resonance frequency, and wherein said modulation is performed substantially at said resonance frequency.

46. An apparatus as in claim 41, wherein one or more of the magnetized bodies are ferromagnetic.

47. An apparatus as in claim 41, wherein one or more of the magnetized bodies are electromagnets.

48. An apparatus as in claim 41, wherein at least a portion of said flexible suspension is made of a semiconductor material.

49. An apparatus as in claim 41, wherein said modulating means is operable to mechanically move the material and the magnetized bodies relative to one another to allow measurements of a magnetic property of the material.

50. An apparatus as in claim 41, wherein said modulating means is operable to both change the magnetization direction of the spins in the sample material and mechanically move the material and the magnetized bodies relative to one another.

51. An apparatus as in claim 41, wherein said magnetized bodies are polarized all in a same direction and comprise:
   a cylindrical sensor magnet roughly equal in size to a volume of the material and disposed in close proximity to the material;
   an annular magnet shaped and disposed to surround said sensor magnet; and
   compensating magnets having at least one compensating magnet equal in size and shape to said sensor magnet and one equal in size and shape to said annular magnet, said compensating magnets including a first set of magnets on a first side of the sample material and a second complementary set of magnets on a second side opposing said first side.

52. An apparatus as in claim 41, further comprising means for moving the material relative to the magnetized bodies, creating an imaging capability or a capability to select from an array of samples.

53. An apparatus as in claim 41, further comprising at least one additional module that is similarly constructed to simultaneously measure a magnetic property of an additional sample material, said additional module comprising:
   a sample site, configured to hold the additional sample material;
   means for at least partially aligning the magnetic spins in the additional sample material to produce an average net magnetic polarization;
   magnetized bodies disposed in close proximity to the additional sample material to be subject to magnetic forces exerted by the magnetic spins in the material so that said bodies move relative to one another in response to changes in the magnetic forces exerted by the additional sample material, said magnetized bodies together to produce a substantially homogeneous field throughout the additional sample material;
   means for modulating said forces exerted by the additional sample material; and
   means for detecting the relative motion of the bodies.

54. An apparatus as in claim 41, wherein said material contains nuclear spins and exhibits nuclear magnetic resonance, nuclear quadrupole resonance.

55. An apparatus as in claim 41, wherein said material exhibits electron paramagnetic resonance.

56. An apparatus as in claim 41, further comprising at least one of a means for spinning the sample material and a means for orienting the sample material with respect to crystallographic axes of the sample material.

57. An apparatus as in claim 41, further comprising means for flowing the sample material through a region near at least one magnetized body which is operable to detect a magnetic property of the sample material.

58. An apparatus as in claim 41, wherein said magnetized bodies include permanent magnets.

59. An apparatus as in claim 41, further comprising means to combine the magnetic spin information with data gathered from ancillary analytical techniques, including chromatography, electrophoresis, or mass spectrometry.

60. A method as in claim 41, further comprising performing a quantum computing operation by detecting the relative motion of the bodies and using information of the detected relative motion as an input to the quantum computing operation wherein said information of the detected relative motion is based on at least one magnetic property of the sample material.

61. An apparatus as in claim 41, wherein said modulating means is operable to induce an electronic, chemical, or thermodynamic transition in the sample material.

62. An apparatus as in claim 41, further comprising a position control element operable to substantially maintain the relative positions or orientations of the magnetized bodies at predetermined values according to a feedback signal that is indicative of the magnetic spin information of the sample material.

63. An apparatus as in claim 41, wherein the means for detecting the relative motion of the bodies includes one of an optic-fiber interferometric sensor, an electron-tunneling sensor, a piezoresistive sensor, or a capacitive sensor.

64. An apparatus as in claim 41, further comprising means for using freely precessing magnetization of the spins, or spin-locked magnetization substantially perpendicular to a time-independent part of the magnetic field throughout the sample material, to produce the forces on the magnetized bodies.

65. An apparatus as in claim 10, wherein said magnetic spins are nuclear spins.

66. An apparatus as in claim 10, wherein said sample material includes a paramagnetic material.

67. A method as in claim 11, wherein said magnetic spins are nuclear spins.

68. A method as in claim 11, wherein said sample includes a paramagnetic material.

69. A magnetic force detection method for measuring magnetic properties of a sample material, including magnetic susceptibility and magnetic resonance, said material having magnetic spins with non-zero spin angular momentum, and said method comprising:
   at least partially aligning the magnetic spins in the material to produce an average net magnetic polarization or fluctuation at the sample material;
   disposing magnetized bodies in close proximity to the material to expose said bodies to magnetic forces exerted by the magnetic spins in the material;
   configuring said magnetized bodies in a way so that said bodies together produce a substantially homogeneous field throughout the sample material;
   allowing the bodies to move relative to one another in response to changes in the magnetic forces exerted by the material;
   modulating the forces exerted by the material; and
   detecting the relative motion of the bodies.

70. A method as in claim 63, further comprising: modulating the magnetization of the material during an encoding period that precedes a time period during which motion of the magnetized bodies is detected.

71. A method as in claim 70, further comprising switching a magnetic field gradient at the sample material on and off at least once during an encoding period to encode imaging information.

72. A method as in claim 63, wherein said detecting step includes applying pulses of radio-frequency energy that produce spin evolution of the magnetization of the sample material so as to produce a time-varying longitudinal component of said magnetization.

73. A method as in claim 63, further comprising disposing the sample material and the magnetized bodies in a time-independent static magnetic field.

74. A method as in claim 63, wherein the detecting step includes cyclically inverting the magnetization of the sample material by adiabatic passage.

75. A method as in claim 63, wherein the sample material includes a single-spin particle.

76. A method as in claim 63, further comprising placing the sample material to a location where the magnetic field is different in a prescribed way during an encoding period.

77. A method as in claim 74, wherein said different magnetic field is substantially zero.

* * * * *